(12) United States Patent (10) Patent No.: US 9,136,132 B2
Matsumoto et al. (45) Date of Patent: *Sep. 15, 2015

(54) MANGANESE METAL FILM FORMING METHOD, PROCESSING SYSTEM, ELECTRONIC DEVICE MANUFACTURING METHOD AND ELECTRONIC DEVICE

(71) Applicant: TOKYO ELECTRON LIMITED, Tokyo (JP)

(72) Inventors: Kenji Matsumoto, Nirasaki (JP); Peng Chang, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/140,889

(22) Filed: Dec. 26, 2013

(65) Prior Publication Data

US 2014/0183743 A1 Jul. 3, 2014

(30) Foreign Application Priority Data

Dec. 27, 2012 (JP) ................................ 2012-285442
Dec. 4, 2013 (JP) ................................ 2013-250958

(51) Int. Cl.
*H01L 21/20* (2006.01)
*H01L 21/36* (2006.01)
*H01L 21/285* (2006.01)
*H01L 23/532* (2006.01)
*H01L 21/67* (2006.01)
*H01L 21/768* (2006.01)
(Continued)

(52) U.S. Cl.
CPC .......... *H01L 21/28556* (2013.01); *C23C 16/18* (2013.01); *C23C 16/40* (2013.01); *H01L 21/67207* (2013.01); *H01L 21/76814* (2013.01); *H01L 21/76828* (2013.01); *H01L 21/76831* (2013.01); *H01L 21/76846* (2013.01); *H01L 21/76855* (2013.01); *H01L 21/76867* (2013.01); *H01L 21/76882* (2013.01); *H01L 23/53238* (2013.01)

(58) Field of Classification Search
CPC ................... H01L 23/53238; H01L 21/28556; H01L 21/67207; H01L 21/76814; H01L 21/76828
USPC ........................................... 438/509; 257/774
See application file for complete search history.

(56) References Cited

U.S. PATENT DOCUMENTS

2008/0054466 A1* 3/2008 Nasu et al. ..................... 257/751
2008/0088021 A1* 4/2008 Wada et al. .................... 257/751
2008/0142974 A1* 6/2008 Arakawa ........................ 257/754

(Continued)

FOREIGN PATENT DOCUMENTS

JP 2007-067107 A 3/2007
JP 4236201 B2 3/2009

(Continued)

*Primary Examiner* — Nicholas Tobergte
(74) *Attorney, Agent, or Firm* — Nath, Goldberg & Meyer; Jerald L. Meyer

(57) ABSTRACT

A manganese metal film forming method includes: degassing an underlying layer formed on a processing target by thermally treating the processing target, the underlying layer containing silicon and oxygen; and forming a manganese metal film on the degassed underlying layer by chemical deposition using a gas containing a manganese compound. Forming a manganese metal film includes introducing a gas containing an oxidizing agent to form a partially-oxidized manganese metal film.

30 Claims, 25 Drawing Sheets

(51) Int. Cl.
  *C23C 16/18* (2006.01)
  *C23C 16/40* (2006.01)

(56) References Cited

U.S. PATENT DOCUMENTS

2009/0263965 A1 10/2009 Gordon et al.
2011/0163062 A1* 7/2011 Gordon et al. .................. 216/13
2012/0141667 A1* 6/2012 Kim et al. ..................... 427/123
2014/0183742 A1* 7/2014 Matsumoto ................... 257/751

FOREIGN PATENT DOCUMENTS

JP 2010-242187 A 10/2010
WO 2012/060428 A1 5/2012

* cited by examiner

FIG. 16

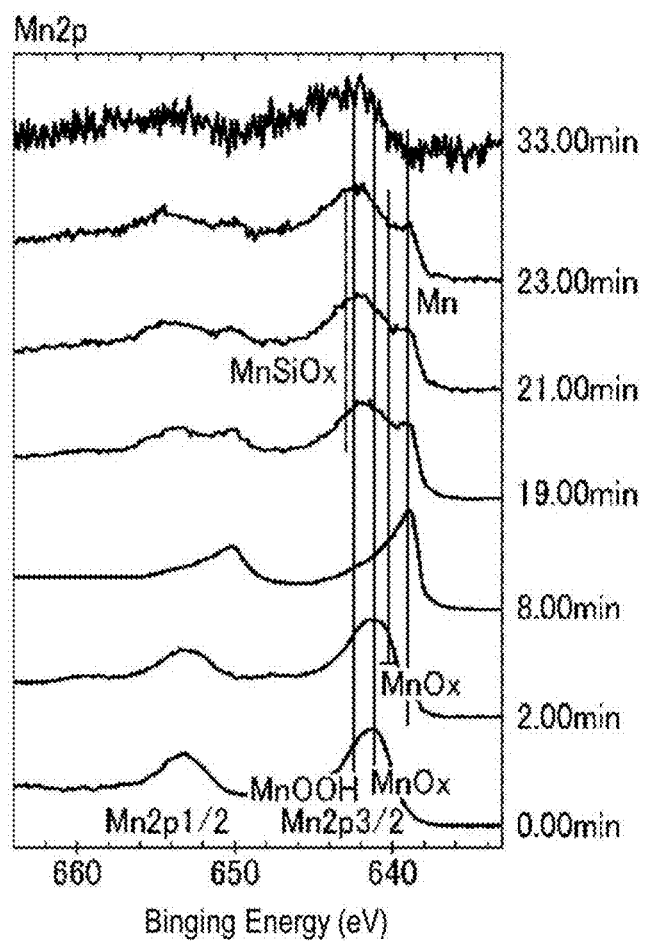

No Oxidizing Agent

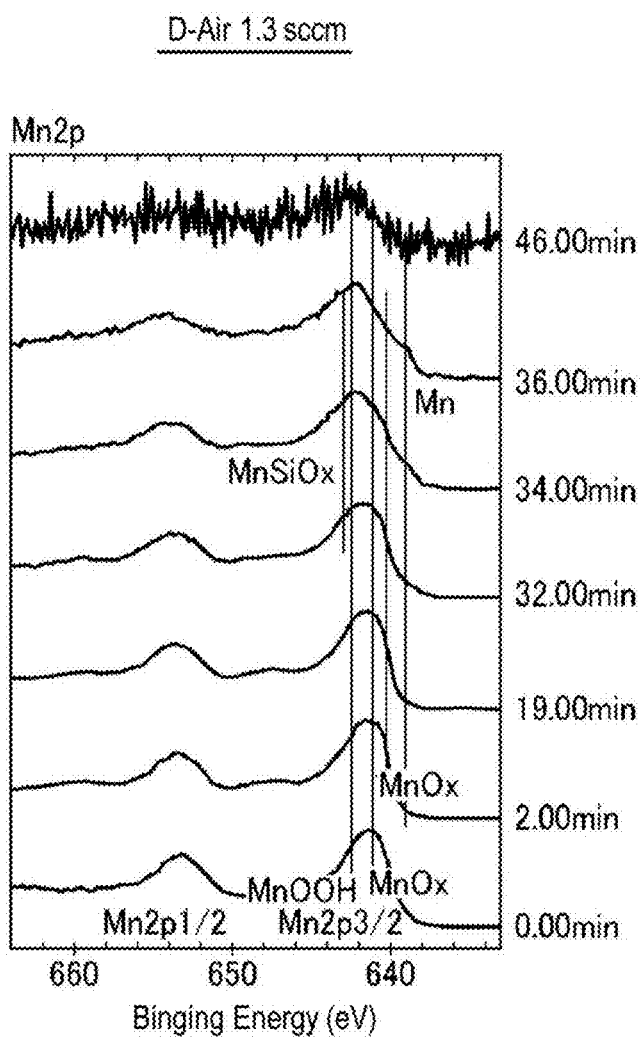

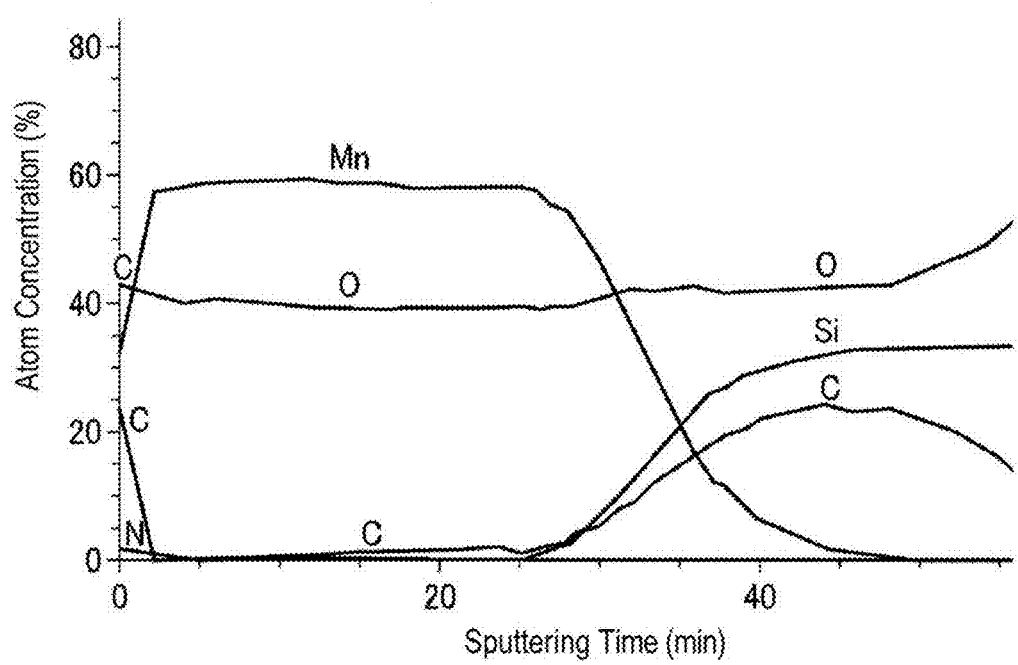

D-Air 3.0 sccm

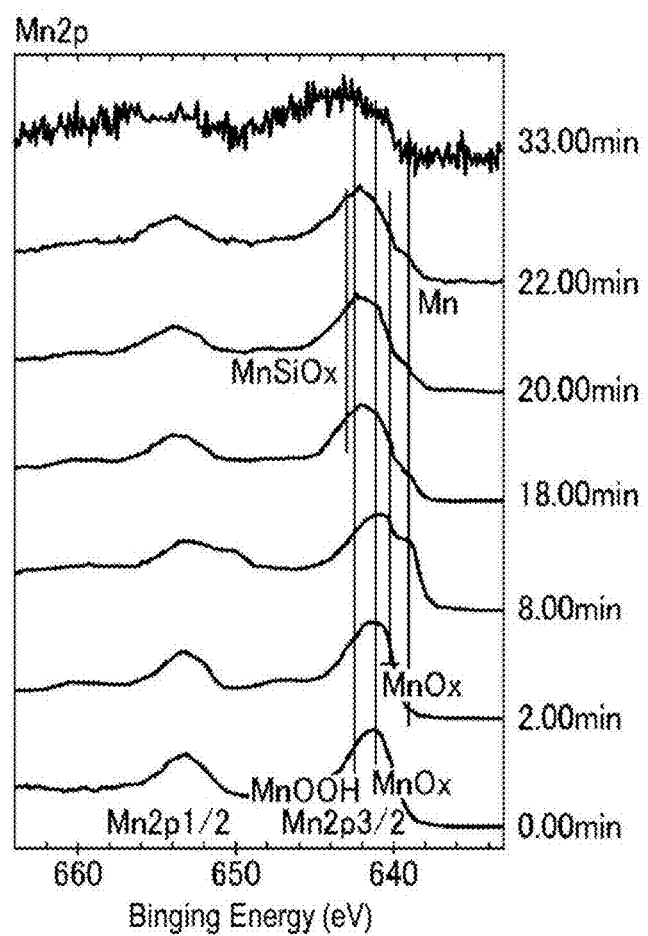

MANGANESE METAL FILM FORMING METHOD, PROCESSING SYSTEM, ELECTRONIC DEVICE MANUFACTURING METHOD AND ELECTRONIC DEVICE

CROSS-REFERENCE TO RELATED APPLICATIONS

This application claims the benefit of Japanese Patent Application Nos. 2012-285442 and 2013-250958, filed on Dec. 27, 2012 and Dec. 4, 2013, respectively, in the Japan Patent Office, the disclosure of which is incorporated herein in their entirety by reference.

TECHNICAL FIELD

The present disclosure relates to a manganese metal film forming method, a processing system, an electronic device manufacturing method and an electronic device.

BACKGROUND

With a view to form ultrafine copper wiring in a semiconductor device, there is proposed a method of forming a barrier film, which is composed of a manganese silicate ($MnSiO_3$ or $Mn_2SiO_4$) film. In this method, a manganese metal film is formed by depositing a manganese metal on a silicon-containing oxide film formed on a substrate through use of a CVD (Chemical Vapor Deposition) method using a manganese precursor. Then, the substrate having the manganese metal film formed thereon is annealed for five minutes at a temperature of 300 to 400 degrees C. under an atmosphere added with a small amount of oxygen. Thus, the manganese metal becomes a silicate by reacting with silicon and oxygen of the underlying silicon-containing oxide film, whereby a manganese silicate film is formed.

In this method, the annealing is performed after forming a copper film on a manganese metal film.

Examples of manganese precursors used in the CVD method include: a cyclopentadienyl-based manganese compound, e.g., $(EtCp)_2Mn$(bis(ethyl cyclopentadienyl)manganese); an amidinate-based manganese compound, e.g., bis(N, N'-dialkylacetamininate) manganese expressed by a chemical formula $Mn(R^1N—CR^3—NR^2)_2$; and an amideaminoalkane-based manganese compound, e.g., bis(N,N'-1-alkylamide-2-dialkylaminoalkane) manganese expressed by a chemical formula $Mn(R^1N—Z—NR^2_2)_2$. In the chemical formulae noted above, "R", "$R^1$", "$R^2$" and "$R^3$" are functional groups described by —$C_nH_{2n+1}$ (where n is an integer of 0 or greater) and "Z" is a functional group described by —$C_nH_{2n}$— (where n is an integer of 0 or greater).

As a method of depositing a manganese metal, an ALD (Atomic Layer Deposition) method as well as the CVD method is studied.

As copper wiring becomes finer, it is required to make a barrier film thinner. However, if a manganese metal film is formed by depositing a manganese metal on a silicon-containing oxide film as an underlying layer through the use of a CVD method, it was found that, at an initial film forming stage, manganese agglomerates into a granular shape and does not form a continuous thin film. For that reason, if an attempt is made to obtain a barrier film of, e.g., several nanometers in thickness, by forming a thin manganese metal film and then converting the manganese metal film into a silicate, the resulting film is not a continuous thin film and does not serve as a barrier film. Furthermore, a barrier film composed of a manganese silicate film cannot be said to have sufficiently high adhesion to an upper layer metal film (e.g., a copper film).

SUMMARY

Some embodiments of the present disclosure provide a manganese metal film forming method using chemical deposition (CVD or ALD), capable of obtaining a barrier film which can be reliably formed into a continuous thin film and which is high in a barrier property and an adhesion property.

Furthermore, some embodiments of the present disclosure provide a processing system capable of carrying out the manganese metal film forming method, an electronic device manufacturing method using the manganese metal film forming method and an electronic device obtained by the electronic device manufacturing method.

In accordance with a first aspect of the present disclosure, there is provided a manganese metal film forming method including: degassing an underlying layer formed on a processing target by thermally treating the processing target, the underlying layer containing silicon and oxygen; and forming a manganese metal film on the degassed underlying layer by chemical deposition using a gas containing a manganese compound, wherein forming a manganese metal film includes introducing a gas containing an oxidizing agent to form a partially-oxidized manganese metal film.

In accordance with a second aspect of the present disclosure, there is provided a manufacturing method of an electronic device having an underlying layer containing silicon and oxygen and a manganese-containing structure formed on the underlying layer. The method includes: forming a partially-oxidized manganese metal film on the underlying layer containing silicon and oxygen according to the method of the first aspect to thereby form an interfacial layer made of a manganese silicate film in an interface between the partially-oxidized manganese metal film and the underlying layer in the manganese-containing structure.

In accordance with a third aspect of the present disclosure, there is provided an electronic device including: an underlying layer containing silicon and oxygen; and a manganese-containing structure formed on the underlying layer, wherein the manganese-containing structure is formed according to the method of the second aspect.

In accordance with a fourth aspect of the present disclosure, there is provided a processing system for forming a manganese silicate film by converting a manganese metal into a silicate. The system includes: a degassing unit configured to perform a degassing process with respect to a processing target having an underlying layer containing silicon and oxygen; a manganese metal deposition unit configured to form a manganese metal film by depositing a manganese metal on the degassed processing target; and a metal deposition unit configured to form a metallic film by depositing a metal on the processing target on which the manganese metal is deposited, wherein the degassing unit is configured to perform degassing a underlying layer according to the first aspect and the manganese metal deposition unit is configured to perform forming a manganese metal film according to the first aspect With the present disclosure, it is possible to provide a manganese metal film forming method using chemical deposition (CVD or ALD), capable of obtaining a barrier film which can be reliably formed into a continuous thin film at a reduced thickness and which is high in a barrier property and a adhesion property.

Furthermore, it is possible to provide a processing system capable of carrying out the manganese metal film forming method, an electronic device manufacturing method using the manganese metal film forming method and an electronic device obtained by the electronic device manufacturing method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 16 shows SEM photographs of manganese films formed by changing the amount of a dry air as an oxidizing agent to 0 sccm, 1.3 sccm and 3.0 sccm in test example 3.

FIGS. 19A and 19B are views showing the XPS analysis results of a sample obtained by depositing a manganese film without using an oxidizing agent in test example 5-2. FIG. 19A shows a spectrum of Mn2p and FIG. 19B shows concentrations of individual elements in a depth direction of a film.

FIGS. 20A and 20B are views showing the XPS analysis results of a sample obtained by depositing a manganese film while supplying dry air as an oxidizing agent at 1.3 sccm in test example 5-2. FIG. 20A shows a spectrum of Mn2p and FIG. 20B shows concentrations of individual elements in a depth direction of a film.

FIG. 21A shows a spectrum of Mn2p and FIG. 21B shows concentrations of individual elements in a depth direction of a film.

FIGS. 22A and 22B are views showing the XPS analysis results of a sample obtained by depositing a manganese film while supplying dry air as an oxidizing agent at 3.0 sccm only in the first half of a film forming process in test example 5-2. FIG. 22A shows a spectrum of Mn2p and FIG. 22B shows concentrations of individual elements in a depth direction of a film.

DETAILED DESCRIPTION

Figure 1:
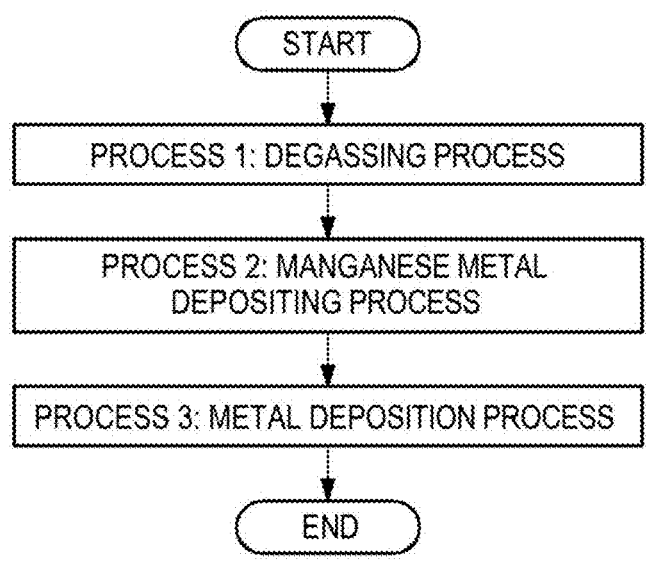
FIG. 1 is a flowchart showing one example of a manganese metal film forming method according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The present inventor conducted research over and over to solve the aforementioned problems and, consequently, found the following facts. There is a concept of Tammann temperature which indicates a temperature at which self-diffusion (the mutual position exchange of the same kind of molecules or atoms caused by thermal motion) is started within different kinds of solids. In case of a metal, the following approximate relation is established between the Tammann temperature Ta (K) and the melting point Tm (K) of a solid: $Ta \approx 0.33 \times Tm$ [References: "Kagakudaijiten", p 267 (1963, Kyoritsu Publication, Japan) and "Kagakujiten", p 829 (1994, Tokyo Chemistry Coterie, Japan)]. Since the melting temperature of manganese is 1244 degrees C. (1517K=1244+273), the Tammann temperature of manganese Ta becomes equal to about 228 degrees C. (about 501K=1517×0.33). Therefore, if a manganese metal film is deposited at a temperature of about 250 degrees C., there is a possibility that a manganese metal undergoes self-diffusion and agglomerates. In reality, it is likely that the agglomeration begins at a temperature far lower than 250 degrees C. If a manganese metal can be deposited by thermal CVD at a temperature far lower than the Tammann temperature, e.g., 100 degrees C. or less, there is a possibility that a continuous thin film is formed at a small thickness of, e.g., several nanometers. However, in the existing manganese metal film forming method using thermal CVD, the film forming temperature is in a range of about 250 to 500 degrees C. depending on the kind of manganese compounds which become a precursor of a manganese metal film. If an attempt is made to form a manganese metal film at a small thickness of several nanometers, it may be only possible to deposit agglomerated manganese.

If a film is formed on a silicon-containing oxide film by thermal CVD at 400 degrees C. or less using a cyclopentadienyl-based manganese compound, e.g., $(EtCp)_2Mn$(bis(ethyl cyclopentadienyl)manganese), as a precursor, the film thus formed becomes a manganese oxide film due to the residual moisture (physical adsorption water and chemical adsorption water) contained in the silicon-containing oxide film. In an XPS (X-ray Photoelectron Spectroscopy) analysis of this film, no metal-manganese bond is observed. The film is deposited as a complete manganese oxide and becomes a continuous thin film despite the thickness thereof being as thin as several nanometers. Presumably, this is because an oxide of a metal is lower in surface energy than the metal.

As represented in chemical reaction formula (1) below, a manganese metal rarely reacts with a silicon-containing oxide film. Therefore, for the purpose of forming a manganese silicate film to secure a barrier property, a manganese oxide is needed as represented in chemical reaction formula (2) below. However, if the entire film is formed of a manganese oxide, the surface of the film consists of a manganese oxide or a manganese silicate. Thus, the adhesion to an upper layer metal film becomes problematic (In this regard, a reaction by which a manganese oxide becomes a manganese silicate is self-limited. Therefore, a manganese oxide having a thickness equal to or larger than a threshold thickness cannot become a silicate and is left as a manganese oxide.). It is therefore necessary for a manganese metal to remain as an interface with an upper layer metal film (e.g., a copper film).

Even if a manganese metal is deposited on a silicon-containing oxide film, it is not possible to obtain a silicate by merely annealing. The reason will be described below.

For example, a reaction formula by which a manganese metal and an underlying silicon dioxide ($SiO_2$) react with each other is given by: (1) $Mn+SiO_2 \rightarrow MnSiO_2$. $MnSiO_2$ lacks one oxygen atom as compared with $MnSiO_3$ which is chemically stable. It is presumed that a reaction from the left side to the right side in formula (1) does not occur because when "oxidizing specie," it is deficient to have a manganese metal react with an underlying material and to convert the manganese metal into a silicate.

Next, a chemical reaction formula of a manganese oxide (MnO) and a silicon dioxide is given by: (2) $MnO+SiO_2 \rightarrow MnSiO_3$ ($\Delta Gr$: −21 kJ/Mn-mol). The chemical reaction formula shows an equilibrium state at 300K. The heat quantity of the right side means a heat quantity (kJ) per mol of manganese (Mn). The Gibbs free energy change amount (hereinafter referred to as "Gr change amount ($\Delta Gr$)") is indicated by a two-digit effective number. In this regard, the Gibbs free energy tends to voluntarily decrease. Thus, a chemical reaction having a negative Gr change amount occurs voluntarily but a chemical reaction having a positive Gr change amount does not occur voluntarily. It can be seen from chemical reaction formula (2) that, in the case of MnO, a reaction can proceed from the left side to the right side. That is to say, it can be noted that it is possible that a silicate may form.

In view of the above points, if manganese is deposited as partially oxidized manganese (e.g., a mixture of MnO and Mn) and not as a pure manganese metal, it is possible to deposit manganese as a continuous thin film at a small thickness of several nanometers with no agglomeration, thereby allowing a manganese metal to remain as an interface with an upper layer metal film.

<First Embodiment>

FIG. 1 is a flowchart showing one example of a manganese metal film forming method according to a first embodiment of the present disclosure. FIGS. 2A to 2D are section views showing one example in which the manganese metal film forming method according to the first embodiment is applied to a semiconductor substrate. In reality, use is made of a substrate on which a pattern such as a dual damascene or the like is formed. In the present embodiment, however, the substrate will be briefly described as a blanket film.

<Base for the Formation of Manganese Metal Film>

Figure 2A:
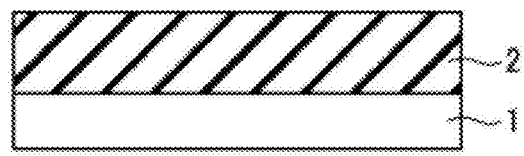
FIGS. 2A to 2D are section views showing one example in which the manganese metal film forming method according to the first embodiment is applied to a semiconductor substrate.

First, description will be made on a base for the formation of a manganese metal film. In the present embodiment, as shown in FIG. 2A, a semiconductor substrate (semiconductor wafer), e.g., a silicon substrate 1, on the surface of which a silicon-containing oxide film 2 containing silicon and oxygen is formed, is used as a base (sample) for the formation of a manganese metal film. The silicon-containing oxide film 2 serves as an underlying layer on which a manganese metal film is formed. The silicon-containing oxide film 2 of the present embodiment is formed by a CVD method using, e.g., tetraethoxysilane (TEOS), as a source gas. The silicon-containing oxide film 2 is a film mainly composed of $SiO_2$. It is only necessary that the silicon-containing oxide film 2 contains silicon and oxygen. In addition to the film of the present embodiment mainly composed of $SiO_2$, a silicon-containing oxide film (a low-k film) which is lower in relative dielectric constant than $SiO_2$, such as a SiOC film or a SiOCH film, may be used as the silicon-containing oxide film 2. The low-k film containing silicon and oxygen may be a porous low-k film.

<Process 1: Degassing Process>

The base (sample) is subjected to a degassing process, namely process 1 shown in FIG. 1. In this process, the sample shown in FIG. 2A is heated to degas impurities such as residual moisture and the like (mainly, a part of physical adsorption water and chemical adsorption water) adsorbed to a surface of the silicon-containing oxide film 2. In order to degas the impurities such as residual moisture and the like, the degassing temperature in process 1 is set, e.g., equal to or higher than 150 degrees C. and equal to or lower than 350 degrees C. In some embodiments, the degassing temperature may be equal to or higher than 200 degrees C. and equal to or lower than 300 degrees C. One example of specific degassing conditions is as follows.

Processing atmosphere: inert gas atmosphere or forming gas atmosphere

Processing pressure: 1333 Pa (10 Torr)

Processing temperature: 300 degrees C.

Processing time: 180 seconds

One example of the inert gas is an argon (Ar) gas. One example of the forming gas is a mixture of 3% of a hydrogen ($H_2$) gas and 97% of a nitrogen ($N_2$) gas. In the forming gas, the ratio of the hydrogen gas to the nitrogen gas is not limited to 3:97. Moreover, the hydrogen may be diluted with a rare gas such as an argon gas or the like instead of the nitrogen gas. The forming gas is not limited to the above example and may be any other gas containing at least hydrogen. If the degassing process is implemented not only to degas residual moisture but also to clean a natural oxide film of a metallic surface exposed in a pattern sample (e.g., a lower layer copper wiring exposed on a bottom of a via-hole), the degassing process may be performed in an atmosphere containing a reducing gas such as a forming gas or the like.

Prior to depositing a manganese metal, the degassing process is performed with respect to the sample to sufficiently degas impurities such as residual moisture and the like from the surface of the silicon-containing oxide film 2 as an underlying layer. Thus, it is possible to suppress, e.g., enlargement of the variation of a thickness of a manganese metal film, which may occur due to the existence or absence of physical adsorption water or the variation of an amount of physical adsorption water (this variation depends on, e.g., the time elapsed after formation of the silicon-containing oxide film 2 or the humidity in the storage environment). It is also possible to suppress formation of a crystalline manganese oxide (which is formed by the reaction of physical adsorption water with a manganese compound gas and may deteriorate a barrier property due to the existence of a crystal grain boundary).

<Process 2: Manganese Metal Deposition Process>

Figure 2B:
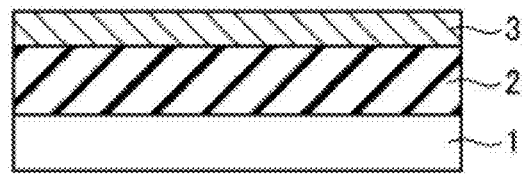

Subsequently, a manganese metal deposition process, namely process 2 shown in FIG. 1, is performed. In this process, as shown in FIG. 2B, a partially-oxidized manganese metal film 3 is formed on the silicon-containing oxide film 2. The partially-oxidized manganese metal film 3 can be formed by a chemical deposition (hereinafter referred to as CVD or ALD) method which makes use of a thermal decomposition reaction of a gas containing a manganese compound, a CVD method which makes use of a manganese-compound-containing gas and a reducing reaction gas, or an ALD method. In the present embodiment, a manganese metal is deposited on the silicon-containing oxide film 2 through the use of a CVD method which makes use of a gas containing a manganese compound and a reducing reaction gas (reducing agent), and introducing a gas containing an oxidizing agent during the deposition of the manganese metal.

<Suppression of Agglomeration>

In process 2, by forming the partially-oxidized manganese metal film 3 as mentioned above, agglomeration of a manganese metal can be suppressed even when the thickness of the partially-oxidized manganese metal film 3 is 20 nm or less, 10 nm or less, e.g., several nanometers. If the gas containing an oxidizing agent is introduced in an unduly large amount, the manganese metal film completely becomes a manganese oxide. Thus, the introduction amount of the gas containing an oxidizing agent is set such that the manganese metal film does not become a complete manganese oxide. Advantages provided by forming a non-complete manganese oxide will be described later. In the present embodiment, there is illustrated an example in which a non-completely-oxidized manganese metal film, i.e., the partially-oxidized manganese metal film 3 is formed on the silicon-containing oxide film 2 as an underlying layer. The underlying layer is not limited to the silicon-containing oxide film 2. The underlying layer may be a mixture of a hard-to-oxidize material, e.g., the silicon-containing oxide film 2, and an easy-to-oxidize but not-to-be-oxidized material, e.g., copper constituting a metal wiring in a semiconductor integrated circuit device. If the hard-to-oxidize material and the easy-to-oxidize but not-to-be-oxidized material are mixed in the underlying layer, an oxidizing agent or an introduction amount of the oxidizing agent may be selected such that the manganese metal is partially oxidized while the easy-to-oxidize but not-to-be-oxidized material is hardly oxidized. If the easy-to-oxidize but not-to-be-oxidized material is a metal wiring of a semiconductor integrated circuit device, e.g., copper, it is necessary that process 2, namely the manganese metal deposition process, be performed under the film formation conditions that do not leave the partially-oxidized manganese metal film 3 on the surface of copper. As will be described later, the film formation conditions can be set in view of the phenomenon that manganese atoms are diffused into copper.

The oxidizing agent usable in the present embodiment includes, e.g., $H_2O$, $O_2$, $CO_2$, HCOOH, $NO_x$ ($N_2O$, NO or $NO_2$) and air, one or more of which can be selected as the oxidizing agent.

Advantages and disadvantages of these oxidizing agents were thermodynamically compared and reviewed, the results of which are described below. The chemical reaction formulae given below show an equilibrium state at 300K. The heat quantity of the right side in the chemical reaction formulae means a heat quantity (kJ) per mol of manganese (Mn) or copper (Cu). The Gibbs free energy change amount (hereinafter referred to as "Gr change amount ($\Delta Gr$)") is indicated by a two-digit effective number.

The chemical reaction formulae in case of using $H_2O$ as the oxidizing agent can be represented as follows.

$$H_2O + Mn \rightarrow H_2 + MnO \ldots (\Delta Gr: -130\,kJ/Mn\text{-}mol) \quad (3)$$

$$1.3 H_2O + Mn \rightarrow 1.3 H_2 + 0.3 Mn_3O_4 \ldots (\Delta Gr: -120\,kJ/Mn\text{-}mol) \quad (4)$$

$$1.5 H_2O + Mn \rightarrow 1.5 H_2 + 0.5 Mn_2O_3 \ldots (\Delta Gr: -98\,kJ/Mn\text{-}mol) \quad (5)$$

$$2 H_2O + Mn \rightarrow 2 H_2 + MnO_2 \ldots (\Delta Gr: -7.8\,kJ/Mn\text{-}mol) \quad (6)$$

$$H_2O + Cu \rightarrow H_2 + CuO \ldots (\Delta Gr: +99\,kJ/Mn\text{-}mol) \quad (7)$$

$$0.5 H_2O + Cu \rightarrow 0.5 H_2 + 0.5 Cu_2O \ldots (\Delta Gr: +41\,kJ/Mn\text{-}mol) \quad (8)$$

In the above chemical reaction formulae, $H_2O$ and $H_2$ are in a gas state. Mn, Cu, $MnO_x$ and $CuO_x$ are in a solid state. It can be seen from chemical reaction formulae (3) to (6) that, when oxidizing Mn with $H_2O$, all the reactions proceed from the left side to the right side. The value of $\Delta Gr$ is the smallest and most stable in formulae (3) in which MnO is formed. Therefore, it is highly likely that the oxidization of Mn caused by $H_2O$ does not proceed from Mn up to $MnO_2$ via MnO, $Mn_3O_4$ and $Mn_2O_3$ but stops at MnO.

On the other hand, it can be seen from chemical reaction formulae (7) and (8) that, when oxidizing Cu with $H_2O$, all the reactions do not proceed from the left side to the right side and Cu remains as a metal.

Similarly, thermodynamic reviews were conducted with respect to other oxidizing agents including $O_2$, $CO_2$, HCOOH and $NO_x$ ($N_2O$, NO or $NO_2$), the results of which are summarized in Table 1 below.

TABLE 1

| Oxidizing agent | Oxidization of Mn | Oxidization of Cu |
|---|---|---|
| $H_2O$ | Mn becomes $MnO_x$. MnO is most stable. | Cu is not oxidized |
| $O_2$ | Mn becomes $MnO_x$. Oxidization proceeds to $MnO_2$. | Cu becomes $CuO_x$ |

TABLE 1-continued

| Oxidizing agent | Oxidization of Mn | Oxidization of Cu |
|---|---|---|
| $CO_2$ | Mn becomes $MnO_x$. MnO is most stable. C is likely to remain in the film. | Cu is not oxidized |
| HCOOH | Mn becomes $MnO_x$. $Mn_3O_4$ most stable. C is likely to remain in the film. | Cu is not oxidized |
| $NO_x$ | Mn becomes $MnO_x$. Oxidization proceeds to $MnO_2$. N is likely to remain in the film. | Cu becomes $CuO_x$ |

From the results shown in Table 1, $H_2O$ and $CO_2$ can be cited as examples of an oxidizing agent which does not unduly oxidize a manganese metal. $H_2O$, $CO_2$ and HCOOH can be cited as examples of an oxidizing agent which does not oxidize copper. $H_2O$ and $O_2$ can be cited as examples of an oxidizing agent which does not allow C or N to remain in the film.

When $H_2$ is used as a reducing agent and $H_2O$ is used as an oxidizing agent and when CO is used as a reducing agent and $CO_2$ is used as an oxidizing agent, a partial pressure ratio of the reducing agent and the oxidizing agent which oxidizes Mn but does not oxidize Cu can be found from the Ellingham diagram [see Iron & Steel Handbook I. Basic (Iron and Steel Institute of Japan)]. According to the Ellingham diagram, it is noted that, when the temperature of a gas is equal to 300 degree C., Mn is oxidized but Cu is not oxidized: when a $H_2/H_2O$ partial pressure ratio ranges from $1/10^8$ to $10^{11}/1$ where $H_2$ is used as the reducing agent and $H_2O$ is used as the oxidizing agent; and when a $CO/CO_2$ partial pressure ratio ranges from $1/10^9$ to $10^{10}/1$ where CO is used as the reducing agent and $CO_2$ is used as the oxidizing agent. That is to say, by using the reducing agent and the oxidizing agent in combination, the state in which Mn is oxidized but Cu is not oxidized can be realized in a wide partial pressure ratio range. All the examples of conditions and test conditions described satisfy the aforementioned range.

Taking the oxidizing power of the aforementioned oxidizing agents into account, the oxygen gas ($O_2$) having strong oxidizing power is likely to unduly oxidize a manganese metal and copper. Therefore, the introduction amount of the oxygen gas ($O_2$) needs to be extremely small. Alternatively, the unduly oxidized state of the partially-oxidized manganese metal film 3 may be returned to MnO by forming the partially-oxidized manganese metal film 3 and then annealing the same in a reducing atmosphere. If finely controlled oxidation is needed as in the present embodiment, it is suitable to use water vapor ($H_2O$) because the oxidization of manganese using water vapor ($H_2O$) stops at bivalent "MnO" as mentioned above. In addition, although a manganese oxide may take not only the form of bivalent MnO but also a plurality of other forms such as bivalent and tetravalent $Mn_3O_4$, trivalent $Mn_2O_3$ and tetravalent $MnO_2$, Mn in a manganese silicate ($MnSiO_3$ or $Mn_2SiO_4$) is bivalent. Therefore, it is thought that a silicate is easy to obtain when manganese is not unduly oxidized.

One example of specific deposition conditions in process 2 is as follows.

Manganese compound: amideaminoalkane-based manganese compound
    Gas containing an oxidizing agent: water vapor ($H_2O$) 0.3 sccm
    Reducing reaction gas: hydrogen gas 100 sccm
    Film formation pressure: 40 to 133 Pa (about 0.3 to 1 Torr)
    Film formation temperature: 280 to 350 degrees C.
    Film formation time: 20 to 180 seconds By performing film formation under these conditions, the partially-oxidized manganese metal film 3 as a continuous thin film can be formed on the silicon-containing oxide film 2 at a small thickness of 10 nm or less, e.g., several nanometers.

The thickness of the partially-oxidized manganese metal film 3 can be increased by making the film formation time in process 2 longer than 180 seconds and, conversely, can be reduced by making the film formation time in process 2 shorter than 180 seconds. That is to say, the thickness of the partially-oxidized manganese metal film 3 can be controlled by adjusting the processing time in process 2.

<Formation of Interfacial Layer>

Figure 2C:
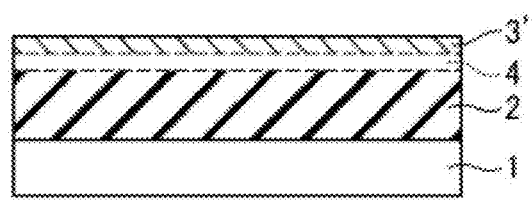

In the present embodiment, a structure in which a manganese silicate film is formed in an interface between a silicon-containing oxide film and a manganese metal film is needed. As shown in FIG. 2C, an interfacial layer 4 is formed on the surface of the silicon-containing oxide film 2 by the heat applied when forming the partially-oxidized manganese metal film 3 as a manganese metal film, and a manganese metal film 3' is formed on the interfacial layer 4. The interfacial layer 4 plays an important role in obtaining the finally required structure.

As mentioned earlier, there is very little reaction between the manganese metal and the silicon-containing oxide. Therefore, if a manganese compound is not included, the structure obtained becomes a two-layer structure of "a manganese metal film and a silicon-containing oxide film". However, the actually required structure is a three-layer structure of "a manganese metal film, an interfacial layer composed of a manganese silicate film or a manganese oxide film, and a silicon-containing oxide film". In order to form the interfacial layer, a partially oxidize the manganese metal film is needed.

If the formation temperature of a manganese metal film is set at 300 degrees C. which is equal to the degassing temperature in process 1 or at 280 degrees C. which is lower than the degassing temperature in process 1 as in the present embodiment, only a manganese metal film not containing an oxide is formed on the silicon-containing oxide film 2. This is because, if the formation temperature of a manganese metal film is equal to or lower than the degassing temperature, it is hard to obtain an effect of oxidization of a manganese metal provided by the residual moisture (chemical adsorption water) existing within the silicon-containing oxide film 2. In other words, if the formation temperature of a manganese metal film is equal to or lower than the degassing temperature, the adsorption binding of the chemical adsorption water contained within the silicon-containing oxide film 2 is not broken and the chemical adsorption water does not come out, in principle, onto the surface of the silicon-containing oxide film 2. Consequently, the chemical adsorption water cannot contribute to a film forming reaction such as CVD or the like, and thus an interfacial layer is not formed.

However, in reality, even though the formation temperature of a manganese metal film is equal to or lower than the degassing temperature, the interfacial layer 4 is formed if the introduction amount of a hydrogen gas as a reducing reaction gas introduced during film formation is large (e.g., 200 sccm).

Figure 3A:
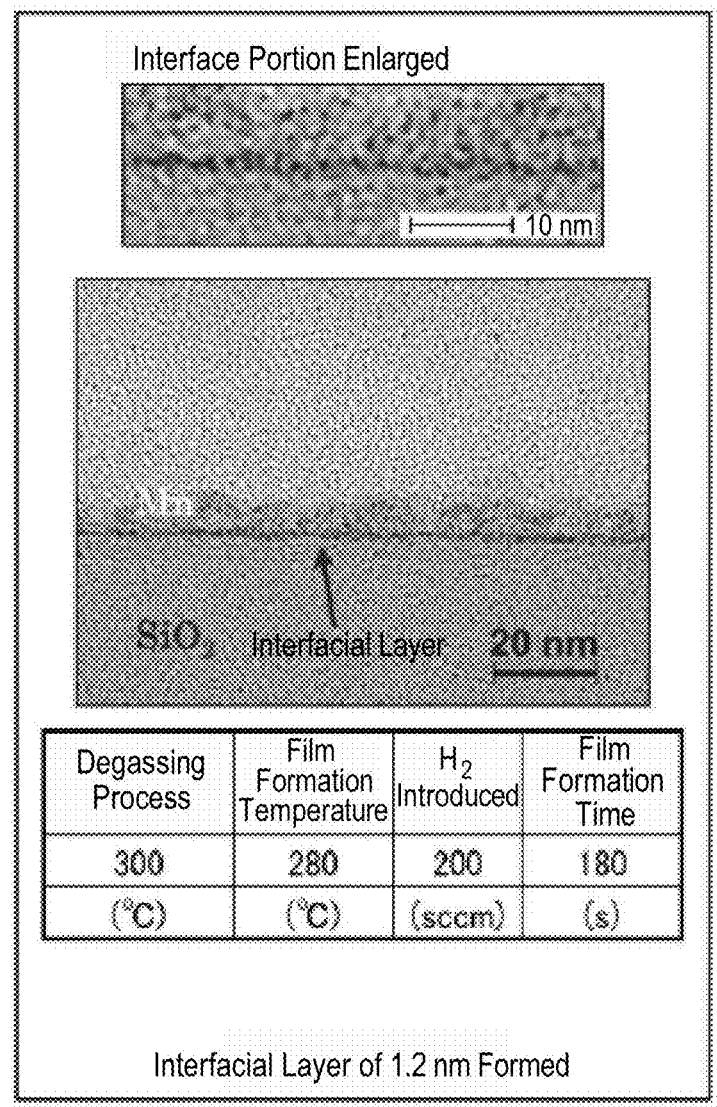
FIG. 3A is a drawing substitute photograph (a transmission electron microscope photograph) showing a cross section of a sample where the introduction amount of a hydrogen gas is large.
Figure 3B:
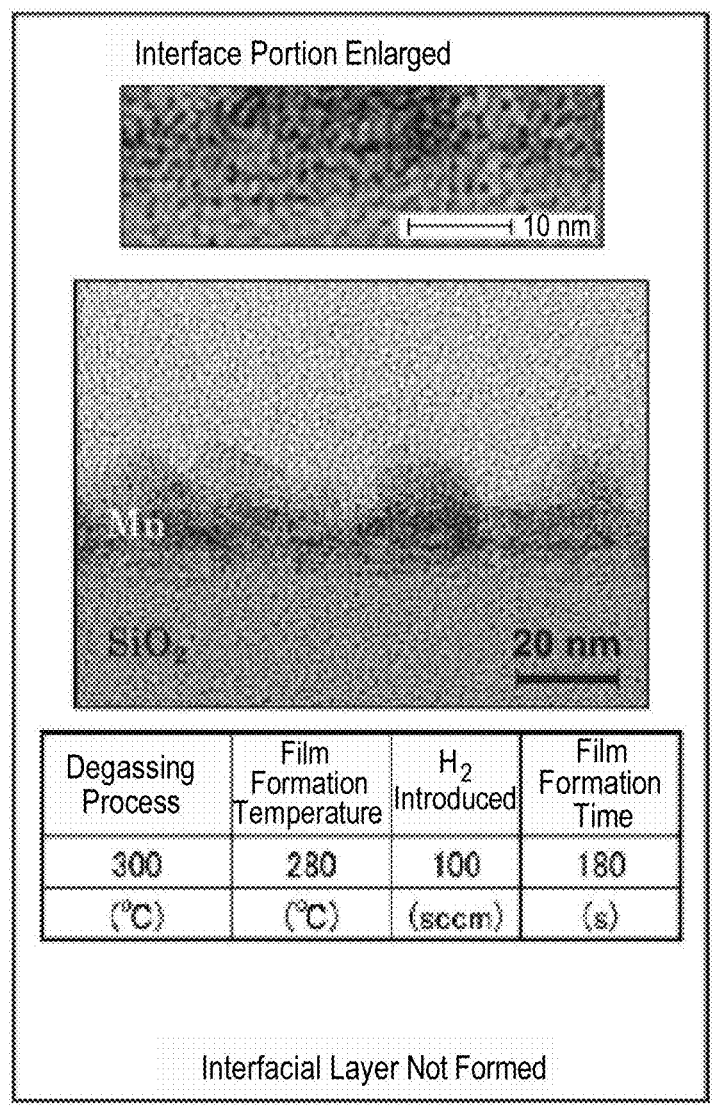
FIG. 3B is a drawing substitute photograph (a transmission electron microscope photograph) showing a cross section of a sample where the introduction amount of a hydrogen gas is small.

FIG. 3A is a transmission electron microscope (TEM) photograph of the sample taken when the introduction amount of a hydrogen gas is large (i.e., 200 sccm). As shown in FIG. 3A, it can be noted that an interfacial layer is formed when a hydrogen gas is introduced at a flow rate of 200 sccm. In contrast, FIG. 3B is a TEM photograph of the sample taken when a hydrogen gas is introduced at a flow rate of 100 sccm. It can be seen in FIG. 3B that an interfacial layer is not formed.

A study was conducted on this difference by monitoring the components of a hydrogen gas. It was found that the purity of a hydrogen gas is not 100% but 99.99% and further that about 1 ppm of water and about 0.3 ppm of oxygen are contained in a hydrogen gas. Therefore, if the introduction amount of a hydrogen gas is large, there is a possibility that the water and the oxygen contained in a hydrogen gas in a small amount may generate a manganese oxide in an interface between the manganese metal film 3 and the silicon-containing oxide film 2, eventually forming the interfacial layer 4. Thus, it was confirmed that, if an oxidizing agent such as water or the like is contained even in a small amount during the formation of a manganese metal film, the interfacial layer 4 is formed as in the example of wet hydrogen mentioned just above.

As shown in FIGS. 3A and 3B, when a hydrogen gas is introduced at a flow rate of 200 sccm or 100 sccm, the manganese metal film (Mn) is granular and is not formed into a continuous thin film. Presumably, this is because, when the hydrogen gas flow rate is 200 sccm, the amount of an oxidizing agent is large enough to form an interfacial layer but is insufficient to form a manganese metal film as a continuous film.

Based on the above verification results, in the present embodiment, a gas containing an oxidizing agent is further introduced in process 2, namely the manganese metal deposition process. Thus, as described above, a continuous film can be formed by suppressing agglomeration of a film even at an initial film formation stage. Moreover, the interfacial layer 4 can be formed by reliably generating a manganese oxide in an interface with the silicon-containing oxide film 2. The interfacial layer 4 may be a manganese silicate formed by the reaction with the silicon-containing oxide film 2 as an underlying layer or may be a manganese oxide which is not converted into a silicate. Even if a manganese oxide is formed as the interfacial layer 4, the manganese oxide can be converted into a silicate when annealing is performed after film formation as will be described later. It may also be possible to employ a structure in which the interfacial layer 4 is formed by a manganese oxide while the manganese metal film 3' is formed by a manganese metal film which contains little manganese oxide or contains a small amount of manganese oxide.

As the mechanisms for forming the manganese metal film at this time, it is possible to cite two mechanisms, namely the increase of a nucleation density attributable to the introduction of an oxidizing agent and the reduction of surface energy attributable to the partial oxidation of a film. Thus, when introducing a gas which contains an oxidizing agent, a large amount of gas may be introduced at the initial film formation stage of process 2, thereby accelerating the nucleation and lowering the surface energy. Thereafter, the introduction amount of the gas containing an oxidizing agent may be gradually reduced. By doing so, at the initial film formation stage, the nucleation of the partially-oxidized manganese metal is accelerated and the surface energy is reduced to form a smooth film. Thereafter, the partial oxidization can be suppressed along with the growth of a manganese metal. Thus, the surface portion of the partially-oxidized manganese metal film 3 can be formed of a manganese metal alone, or the percentage of a manganese metal in the surface portion of the partially-oxidized manganese metal film 3 can be made higher than the percentage of a manganese oxide (in other words, the percentage of a manganese oxide can be made lower than the percentage of a manganese metal) in the surface portion of the partially-oxidized manganese metal film 3. This makes it possible to reliably obtain the structure shown in FIG. 2C. For similar purposes, the introduction of the gas containing an oxidizing agent may be stopped on the way. By doing so, at the initial film formation stage, it is possible to accelerate the nucleation of the partially-oxidized manganese metal while securing the flatness of the film. In the later stages of the film forming process, the surface portion of the manganese metal film 3 can be formed of a manganese metal alone by depositing a manganese metal.

The control of the introduction amount of the gas which contains an oxidizing agent can be realized by, e.g., gradually reducing the introduction amount of the gas containing an oxidizing agent through the use of a ramp-up function of a flow rate controller installed in a gas introduction line through which the gas containing an oxidizing agent is introduced into a processing chamber.

As a raw material of a manganese metal used in process 2, namely a manganese compound which becomes a precursor of a manganese metal, it is possible to use, e.g., a cyclopentadienyl-based manganese compound, a carbonyl-based manganese compound, a betadiketone-based manganese compound, an amidinate-based manganese compound, and an amideaminoalkane-based manganese compound. The manganese metal film 3 can be formed by selecting a gas which contains one or more of these manganese compounds.

Examples of the cyclopentadienyl-based manganese compound include bis(alkylcyclopentadienyl) manganese expressed by a chemical formula $Mn(RC_5H_4)_2$.

Examples of the carbonyl-based manganese compound include decacarbonyl 2 manganese ($Mn_2(CO)_{10}$), methyl cyclopentadienyltricarbonyl manganese (($CH_3C_5H_4$)Mn $(CO)_3$), cyclopentadienyltricarbonyl manganese (($C_5H_5$)Mn $(CO)_3$), methyl pentacarbonyl manganese (($CH_3$)Mn($CO$)$_5$), and 3-(t-BuAllyl)Mn(CO)$_4$.

Examples of the betadiketone-based manganese compound include bis(dipivaloylmethanato) manganese (Mn $(C_{11}H_{19}O_2)_2$), tris(dipivaloylmethanato) manganese (Mn $(C_{11}H_{19}O_2)_3$), bis(pentanedione) manganese (Mn($C_5H_7$ $O_2)_2$), tris(pentanedione) manganese (Mn($C_5H_7O_2)_3$), bis(hexafluoroacetyl) manganese (Mn($C_5HF_6O_2)_{32}$), and tris (hexafluoroacetyl) manganese (Mn($C_5HF_6O_2)_3$).

Examples of the amidinate-based manganese compound include bis(N,N'-dialkylacetamininate) manganese expressed by a chemical formula $Mn(R^1N\text{---}CR^3\text{---}NR^2)_2$.

Examples of the amideaminoalkane-based manganese compound include bis(N,N'-1-alkylamide-2-dialkylaminoalkane) manganese expressed by a chemical formula $Mn(R^1N\text{---}Z\text{---}NR^2)_2$. In the chemical formulae noted above, "R", "$R^1$", "$R^2$" and "$R^3$" are functional groups described by $\text{---}C_nH_{2n+1}$ (where n is an integer of 0 or greater) and "Z" is a functional group described by $\text{---}C_nH_{2n}\text{---}$ (where n is an integer of 0 or greater).

Examples of the temperature for formation of the manganese metal film in case of using these manganese compounds include: 250 to 300 degrees C. in case of using the amideaminoalkane-based manganese compound; 350 to 400 degrees C. in case of using the amidinate-based manganese compound; 400 to 450 degrees C. in case of using (EtCp)$_2$Mn; and 450 to 500 degrees C. in case of using MeCpMn(CO)$_3$. In short, it is only necessary that the film formation temperature be equal to or higher than the thermal decomposition temperature of a precursor. However, if a plasma CVD method is used, it is possible to form a film at a lower temperature or a temperature lower than the thermal decomposition temperature. Use of the plasma CVD method makes it possible to widen the choices of a precursor. Among the manganese compounds stated above, the amideaminoalkane-based manganese compound which makes it possible to form a film at a relatively low temperature can be used.

As the reducing reaction gas for use in reducing the manganese compounds, it is possible to use not only a hydrogen gas but also a carbon monoxide (CO) gas, an aldehyde (R—CHO) gas such as formaldehyde (HCHO) or the like, and a carboxylic acid (R—COOH) gas such as a formic acid (HCOOH) or the like. In this regard, "R" is a functional group described by —$C_nH_{2n+1}$ (where n is an integer of 0 or greater). In case of using a gas other than a hydrogen gas, it may be possible to introduce a hydrogen gas in addition to the gas.

As the method of forming a manganese metal film, it is possible to use not only the CVD method stated above but also a PECVD(Plasma Enhanced CVD) method. In addition, it is possible to appropriately apply and use a thermal ALD method and a PEALD(Plasma Enhanced ALD) method. If a good coverage is not needed, it may be possible to use a PVD(Physical Vapor Deposition) method.

<Process 3: Metal Deposition Process>

Figure 2D:
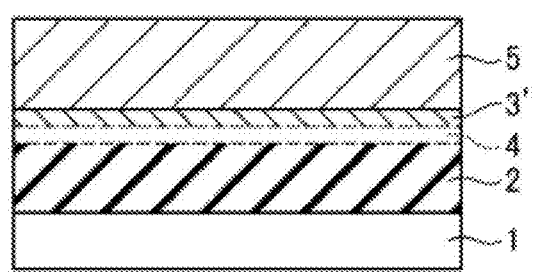

Next, a metal deposition process as process 3 shown in FIG. 1 is performed to form a metallic film 5 on the manganese metal film 3' as illustrated in FIG. 2D. As the metal deposited, it is possible to use, e.g., copper (Cu), ruthenium (Ru), cobalt (Co), or the like.

If using copper (Cu) as the metallic film 5, a copper film may be formed by a PVD method. In this case, the copper film as a whole may be formed by the PVD method. Alternatively, the copper film formed by the PVD method may be used as a plating-purpose seed layer and, by virtue of plating, another copper film may be caused to grow on the copper film formed as the plating-purpose seed layer.

Figure 4A:
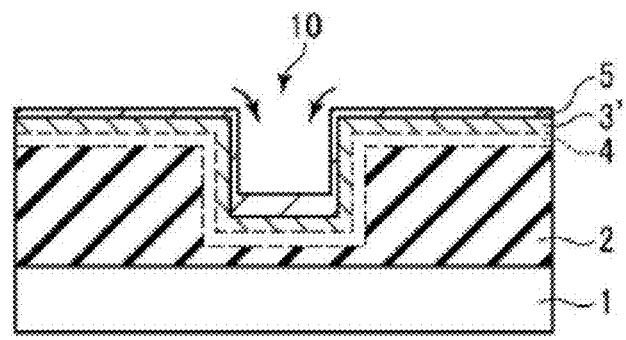
FIGS. 4A to 4C are section views showing a state in which a copper film is formed while performing reflow.
Figure 4B:
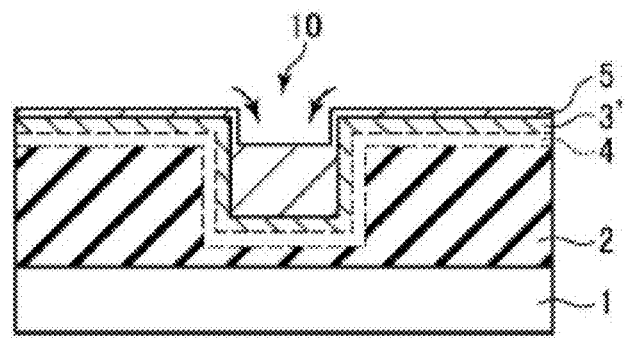
Figure 4C:
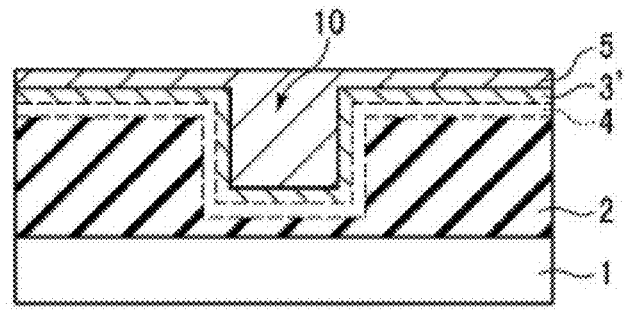

In the case of forming a copper film by a PVD method, copper may be softened by heating a substrate to a temperature of 200 to 400 degrees C., e.g., 300 degrees C. Thus, as shown in FIGS. 4A to 4C, a narrow pattern (e.g., a recess such as a trench or a via-hole) 10 may be buried with copper by reflow. Copper becomes easy to diffuse by an assist effect attributable to the substrate heating temperature and the collision of argon (Ar) ions during a sputtering process. Therefore, as shown in FIGS. 4A to 4C, it is possible to realize a "bottom-up fill" process in which copper is filled upward from the bottom of a narrow pattern (a recess) 10. Manganese shows high wettability, adhesion and affinity with respect to copper. Even if manganese is diffused into copper, the reflow phenomenon of copper is not obstructed by manganese because the diffusion coefficient of manganese within copper is larger than the diffusion coefficient of copper within copper (the self-diffusion coefficient). From the viewpoint of burying a fine pattern with copper, it is desirable to use the reflow of copper in the present embodiment in which the manganese metal film 3' is exposed on a substrate surface.

Figure 5:
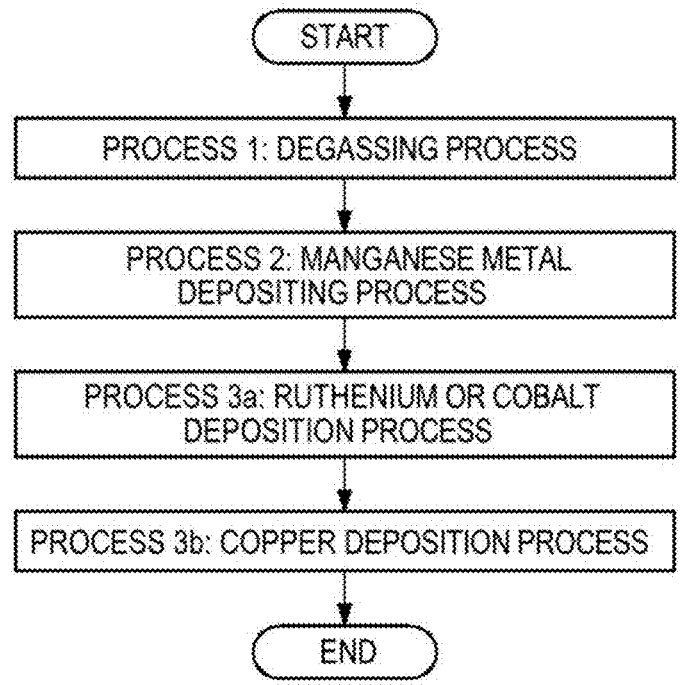
FIG. 5 is a flowchart showing another example of the manganese metal film forming method according to the first embodiment of the present disclosure.

In the case of using ruthenium (Ru) or cobalt (Co) as the metallic film 5, a film may be formed by a CVD method. A simple substance of ruthenium or cobalt may be formed into the metallic film 5. However, as shown in the flowchart of FIG. 5, a ruthenium film or a cobalt film may be formed (process 3a) and then a copper film may be formed (process 3b). When forming the copper film, it may be possible to use a so-called direct plating method in which copper is directly plated using the ruthenium film or the cobalt film as a plating-purpose seed layer.

Furthermore, a copper film as a seed layer may be formed on a ruthenium film or a cobalt film by a PVD method and, by virtue of plating, a copper film may be caused to grow on the seed layer formed of the copper film.

In the case of forming a copper film by a PVD method, ruthenium (Ru) or cobalt (Co) shows high wettability and adhesion with respect to copper. From the viewpoint of burying a fine pattern with copper, it is desirable that the reflow of copper described with reference to FIGS. 4A to 4C is used in a state in which ruthenium (Ru) or cobalt (Co) is exposed on a substrate surface.

Figure 6:
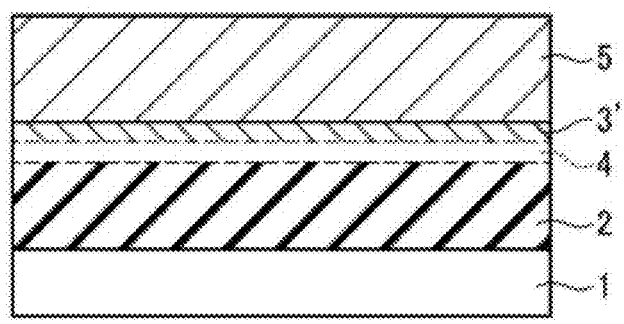
FIG. 6 is a section view showing a reference example.

In the case where a copper film as a metallic film 5 is formed on a partially-oxidized manganese metal film 3, it is considered that there is provided a layered structure in which, as shown in the section view of FIG. 6, a silicon-containing oxide film 2, an interfacial layer 4 formed of a manganese silicate, a manganese metal film 3' and a copper film 5 are layered in the named order from below. In this case, the manganese metal film 3' makes contact with the copper film 5. Due to this metal-to-metal contact, good adhesion is provided by a metal bond.

Figure 7A:
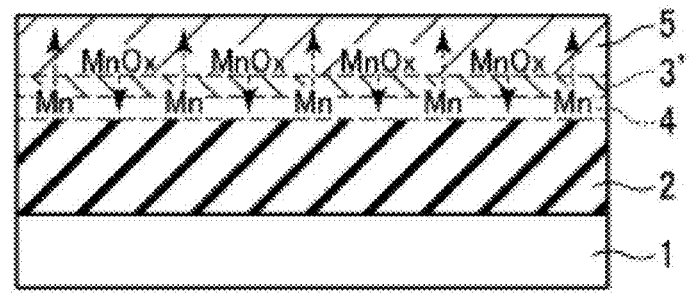
FIGS. 7A to 7C are section views showing a state in which a copper film is being formed.
Figure 7B:
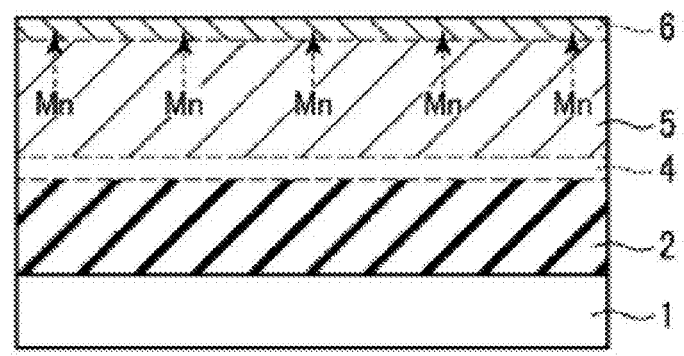
Figure 7C:
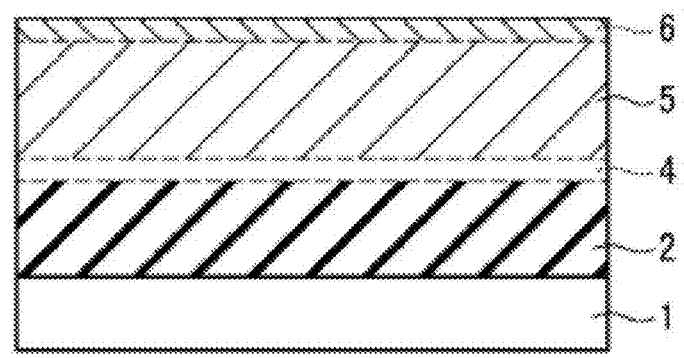

Manganese atoms tend to diffuse within copper. Therefore, if the structure shown in FIG. 6 is thermally treated after formation of the copper film 5 (or while the copper film 5 is formed using the reflow of copper mentioned above) as shown in the section view of FIG. 7A, manganese (Mn) constituting the manganese metal film 3' is diffused into the copper film 5. If a manganese oxide ($MnO_x$) remains in the manganese metal film 3', the manganese oxide ($MnO_x$) is unified with the interfacial layer 4 and is converted into a manganese silicate. At last, as shown in the section view of FIG. 7B, the manganese metal film 3' disappears. Even after the manganese metal film 3' has disappeared, manganese is continuously diffused within the copper film 5 and is finally precipitated(segregated) on the surface of the copper film 5, thereby forming a manganese oxide film 6. Thus, there is provided a layered structure in which, as shown in FIG. 7C, a silicon-containing oxide film 2, an interfacial layer 4 formed of a manganese silicate, a copper film 5 and a manganese oxide film 6 are layered in the named order from below.

Figure 8:
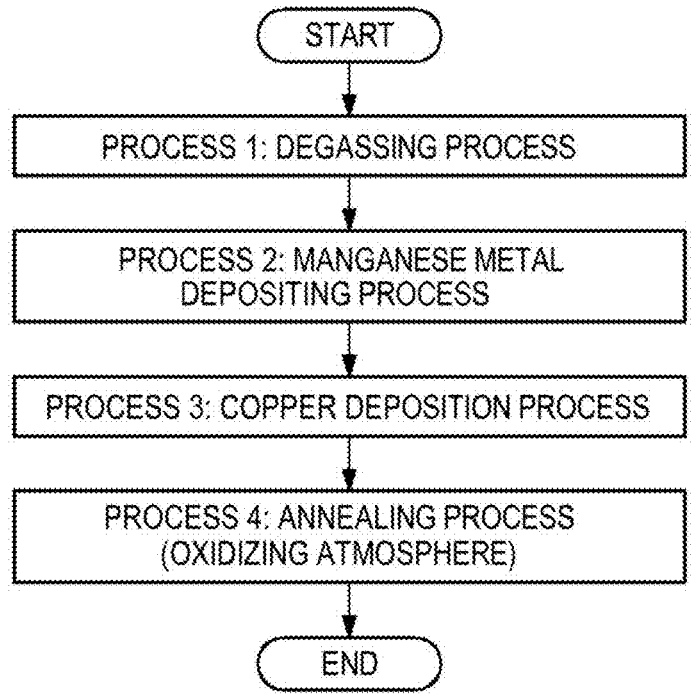
FIG. 8 is a flowchart showing still another example of the manganese metal film forming method according to the first embodiment of the present disclosure.

In the case where process 3 is changed to a copper (Cu) deposition process as shown in the flowchart of FIG. 8, in order to accelerate the diffusion of manganese within copper and to facilitate the precipitation of surplus manganese as the manganese oxide film 6 on the surface of the copper film 5, process 4 may be performed after process 3. In process 4, an annealing process(e.g., at a temperature of 250 to 450 degrees C.) is performed in an oxidizing atmosphere, e.g., in an atmosphere containing a small amount (e.g., about 10 ppb) of oxygen.

With the manganese metal film forming method according to the first embodiment, a gas containing an oxidizing agent is introduced in process 2. It is therefore possible to form manganese into a continuous thin film with no agglomeration. Thus, it is possible to obtain an advantage in that a manganese metal film having a reduced thickness of 20 nm or less, or 10 nm or less, e.g., several nanometers, can be formed as a continuous thin film.

Since a gas containing an oxidizing agent is introduced in process 2, it is possible to reliably generate a manganese oxide in an interface with the silicon-containing oxide film 2. Thus, the interfacial layer 4 formed of a manganese silicate or a manganese oxide can be reliably formed in an interface between a manganese metal film 3 and a silicon-containing oxide film 2. It is therefore possible to obtain an advantage in that a finally required three-layer structure of "a manganese metal film and a manganese silicate film" or "a manganese oxide film and a silicon-containing oxide film" can be formed in a reliable manner.

In a semiconductor integrated circuit device using a copper wiring, a barrier film configured to suppress diffusion of copper is arranged around the copper wiring. The barrier film, if too thick, tends to reduce the cross-sectional area of, e.g., a via-hole or a trench in which the copper wiring is formed, thereby increasing the resistance value of the copper wiring.

For that reason, there is a demand for making the barrier film as thin as possible. However, if the barrier film is too thin, there is a tradeoff relationship in that the barrier property is lowered.

Under these circumstances, if a partially-oxidized manganese metal film 3 formed by the manganese metal film forming method according to the first embodiment is used as a barrier film, it becomes possible to comply with the aforementioned demand. In other words, the partially-oxidized manganese metal film 3 is formed on the silicon-containing oxide film 2, whereby the interfacial layer 4 formed of a manganese silicate or a manganese oxide is formed in an interface with the silicon-containing oxide film 2. Even if the interfacial layer 4 is a manganese oxide formed at the film formation stage, the manganese oxide is converted into a manganese silicate by annealing performed after the film formation. The manganese silicate film which constitutes the interfacial layer 4 is in an amorphous state and is dense. Thus, no crystal grain boundary exists in the manganese silicate film. This makes it possible to realize a high-density barrier film which shows a high barrier property in spite of the reduced thickness.

A manganese silicate is formed into a self-formed barrier by the reaction with the silicon-containing oxide film 2 as an underlying layer. For that reason, most portions of the barrier can be formed at the side of the underlying layer. Thus, it is hard to reduce the barrier cross-sectional area of a via-hole or a trench. Moreover, since the partially-oxidized manganese metal film 3 is formed in the manganese metal film forming method according to the first embodiment, it is possible to form the partially-oxidized manganese metal film 3 as a continuous thin film even if the thickness thereof is reduced to 10 nm or less, e.g., several nanometers. As described above, the present embodiment has an advantage in that it is possible to form a thin barrier film having a high barrier property, which is hard to accomplish while reducing the original cross-sectional area of a via-hole or a trench. For that reason, the manganese metal film forming method according to the first embodiment is very useful in forming a barrier film for a semiconductor integrated circuit device which makes use of copper as a wiring-purpose conductive metal.

In the case of using a ruthenium (Ru) film or a cobalt (Co) film as a metal film, a copper film is used as a seed layer and a copper wiring is formed on the seed layer by a plating method. In this case, ruthenium (Ru) or cobalt (Co) is formed into a liner film on the entire surface. Ruthenium (Ru) or cobalt (Co) is highly conductive but is higher in resistance value than copper. For that reason, the ruthenium (Ru) film or the cobalt (Co) film increases the resistance value of a copper wiring. Furthermore, the liner film made of ruthenium (Ru) or cobalt (Co) reduces the original cross-sectional area of a via-hole or a trench. However, as mentioned above, in the manganese metal film forming method according to the first embodiment, it is hard to reduce the original cross-sectional area of, e.g., a via-hole or a trench. Thus, the manganese metal film forming method according to the first embodiment is useful in forming a layered structure of a barrier film and a ruthenium (Ru) film or a cobalt (Co) film.

As described in, e.g., JP2011-134317A, the ease of deposition of a Ru film in a ruthenium (Ru)-CVD process varies depending on whether the surface of an underlying layer is a metal or an oxide (the incubation time for Ru film formation is shortened on the metal). Therefore, if the first embodiment in which a manganese metal film 3 is formed on a substrate surface is applied, the CVD-ruthenium film deposited on the manganese metal film 3 is formed within a short incubation time. This is desirable from the viewpoint of productivity.

The manganese metal film forming method according to the first embodiment can additionally provide the following effects.

(1) For example, as described above, the manganese silicate which constitutes the interfacial layer 4 is amorphous and, therefore, has no crystal grain boundary. Thus, as compared with a barrier film having a crystal grain boundary, it is possible to improve a barrier property that suppresses the diffusion of a conductive metal of an electronic device, e.g., a semiconductor device, in an inter-layer insulating film, e.g., the diffusion of copper in an inter-layer insulating film. Furthermore, a manganese silicate serves to prevent moisture or oxygen contained in an inter-layer insulating film from diffusing toward a wiring and oxidizing or corroding a conductive metal of a semiconductor device (e.g., copper of a wiring or Ta of a barrier film).

(2) As described above, the manganese silicate which constitutes the interfacial layer 4 reacts with a silicon-containing oxide film as an underlying layer and serves as a self-formed barrier. Therefore, most portions of the manganese silicate are formed at the side of an underlying layer. This enables the manganese silicate to approach a "zero-thickness barrier". It is therefore possible to suppress the reduction of an original cross-sectional area of a via-hole or a trench. This is advantageous in reducing the resistance of a metal wiring embedded in a via-hole or a trench.

(3) A manganese oxide exists in a variety of states such as $MnO$, $Mn_3O_4$, $Mn_2O_3$ and $MnO_2$. Consequently, the valence of manganese can take a plurality of states from bivalence to tetravalence. The density or volume of a manganese oxide may possibly be changed depending on the aforementioned states. However, once a manganese silicate ($MnSiO_3$ or $Mn_2SiO_4$) is formed, the state thereof becomes more stable than the state of a manganese oxide. Thus, the post-manufacture aged deterioration of an electronic device, e.g., a semiconductor device, is reduced.

(4) By forming the partially-oxidized manganese metal film 3, it becomes possible to form the interfacial layer 4 and the manganese metal film 3' thereon. In case of forming the next thin film, e.g., the copper film 5, it is possible to further enhance the adhesion of the interfacial layer 4 and the copper film 5.

It can be said that the manganese silicate which constitutes the interfacial layer 4 is a material more stable than a manganese oxide. For that reason, it can be said that the manganese silicate is a material which is more difficult to adhere to other adjoining material than a manganese oxide.

In the present embodiment, the manganese silicate formed as the interfacial layer 4 is obtained by converting the partially-oxidized manganese metal film 3 into a silicate. The interfacial layer 4 and the manganese metal film 3' existing on the interfacial layer 4 are originally formed into a one-piece film.

Moreover, manganese tends to diffuse into, e.g., copper. Therefore, if the copper film 5 is formed on the manganese metal film 3', manganese atoms are diffused into the copper film 5 during the formation of the copper film 5 (in case of using a reflow) and/or during the heat treatment performed after the formation of the copper film 5. As the diffusion proceeds, the manganese metal film 3' disappears. As a result of disappearance of the manganese metal film 3', the copper film 5 adjoins the interfacial layer 4, which is originally one-piece formed with the partially-oxidized manganese metal film 3, while continuously forming a transitive region. This phenomenon is an atom-level phenomenon which occurs when at least manganese atoms move within the copper film 5 during or after film formation. Thus, the adhesion in a joint section of the copper film 5 and the interfacial layer 4 becomes strong.

From this viewpoint, it is more advantageous to partially oxidize the manganese metal film 3 than to completely oxidize the manganese metal film 3 in improving the adhesion of, e.g., the interfacial layer 4 and other material adjacent to the interfacial layer 4.

In particular, the improvement of adhesion between the interfacial layer 4 which constitutes a barrier film and the conductive metal, e.g., copper, which constitutes a metal wiring formed on the interfacial layer 4 makes it possible to enhance a stress migration resistance (an SM resistance). The improvement of adhesion is advantageous in prolonging the lifespan of an electronic device, e.g., a semiconductor integrated circuit device.

The copper film 5 into which manganese atoms are diffused is an alloy of copper and manganese. As described above, the manganese atoms diffused into the copper film 5 can be removed from the copper film 5, e.g., during the formation of the copper film 5 and/or by the heat treatment of the copper film 5. This makes it possible to return the copper film 5 to a substantially pure copper film 5. Therefore, even if manganese atoms are diffused into the copper film 5, it is possible to substantially eliminate adverse effects such as an increase in a physical resistance value, e.g., a sheet resistance, of the copper film 5.

If manganese atoms are diffused into the copper film and if a small amount of manganese atoms remain in the peripheral edge portion of a copper wiring, it is possible to enhance an electro-migration resistance (an EM resistance). This is advantageous in prolonging the lifespan of an electronic device, e.g., a semiconductor integrated circuit device. A film (such as SiN, SiC or SiCN) serving as a copper barrier and an etching stopper is formed on a copper wiring. In order to secure adhesion between the copper wiring and the barrier film such as SiCN or the like to thereby enhance the wiring reliability, a cap layer including diffused manganese may be formed on the copper wiring.

The first embodiment can be effectively applied to a method for manufacturing an electronic device which includes a manganese-containing structure having an interfacial layer 4 made of a manganese silicate, e.g., a method for manufacturing a semiconductor integrated circuit device. For example, if the structure included in an electronic device is formed according to the first embodiment, the aforementioned effects can be obtained in a method for manufacturing an electronic device, e.g., a semiconductor integrated circuit device.

If the electronic device is a semiconductor integrated circuit device, one example of the aforementioned structure may be a barrier film which is formed between a metal wiring existing within the semiconductor integrated circuit device and an inter-layer insulating film and which is configured to suppress diffusion of a metal contained in the metal wiring.

Examples of a conductive metal which constitutes the conductive metal wiring include copper, ruthenium and cobalt. The conductive metal may include two or more elements selected form the group consisting of these three conductive metals.

A PVD method may also be used, e.g., a method in which a self-formed barrier containing a manganese oxide or a manganese silicate is formed by sputtering a copper-manganese (CuMn) alloy target and forming a copper-manganese alloy film on an underlying layer. However, in this method of forming the copper-manganese alloy film, it is hard to obtain desirable step coverage and it is difficult to bury a narrow pattern.

In contrast, according to the first embodiment, namely a method in which a self-formed barrier containing a manganese oxide or a manganese silicate is formed by forming a manganese metal film on an underlying layer by a CVD method, it is possible to perform the aforementioned reflow of copper, e.g., during the formation of a copper film. This makes it possible to reliably bury a narrow pattern. As compared with a method in which a copper-manganese alloy film is formed on an underlying layer by sputtering a copper-manganese alloy target, the present embodiment is advantageous in manufacturing an electronic device, e.g., a semiconductor integrated circuit device, which has a fine and narrow pattern.

As for the film formation temperature, the film formation temperature is room temperature in the case of the PVD method while the film formation temperature is equal to or higher than a decomposition temperature of a precursor in the CVD method. As for the supply of manganese, manganese atoms are supplied in the case of the PVD method while organic metal complex molecules are supplied in the case of the CVD method.

In other words, the manganese metal film forming method using a CVD method, which has been described above in respect of the first embodiment, is a technology not suggested by but clearly distinguished from the manganese metal film forming method using a PVD method or the manganese-containing film forming method using a PVD method.

<Second Embodiment>

Figure 9:
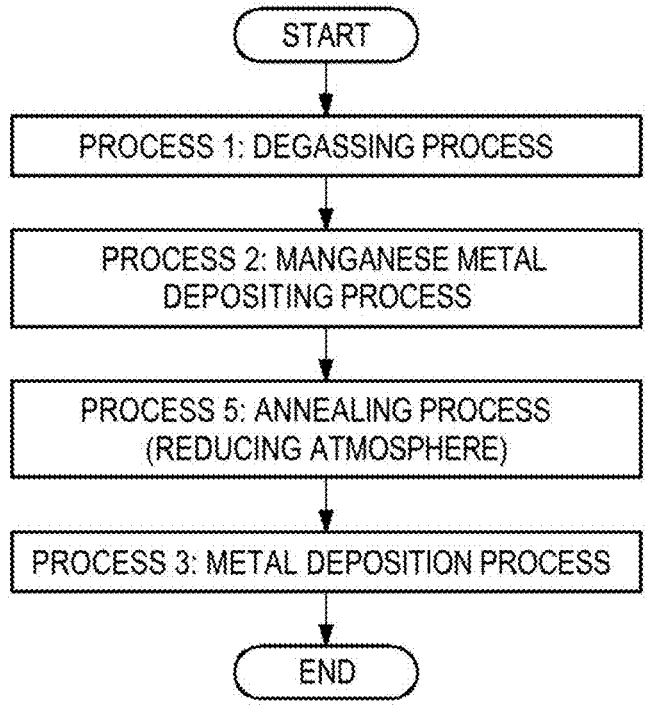
FIG. 9 is a flowchart showing one example of a manganese metal film forming method according to a second embodiment of the present disclosure.

FIG. 9 is a flowchart showing one example of a manganese metal film forming method according to a second embodiment of the present disclosure.

After forming the partially-oxidized manganese metal film 3 in process 2 of the manganese metal film forming method according to the first embodiment shown in FIG. 1, if necessary, annealing(process 5) may be performed in a reducing atmosphere as shown in FIG. 9.

For example, annealing is performed at an annealing temperature of 350 degrees C. using a forming gas containing hydrogen (3% $H_2$+97% $N_2$) as a reducing atmosphere. In the case where the major purpose of the annealing is to convert a manganese oxide into a silicate, annealing is performed at a temperature higher than a silicate-forming threshold value (presumably, about 350 degrees C.). Examples of the reducing atmosphere used in the annealing include not only the aforementioned forming gas but also a hydrogen gas, an aldehyde (R—CHO) gas such as formaldehyde (HCHO) or the like, and a carboxylic acid (R—COOH) gas such as a formic acid (HCOOH) or the like. In this regard, "R" is a functional group described by —$C_nH_{2n+1}$ (where n is an integer of 0 or greater).

It is sometimes the case that the reducing atmosphere does not contain hydrogen. One example of the reducing atmosphere not containing hydrogen is a carbon monoxide (CO).

The annealing need not be necessarily performed. However, for example, if a manganese oxide is formed as the interfacial layer 4, there is a need to perform annealing in order to convert the manganese oxide into a manganese silicate. This is because the heat applied during the annealing causes a manganese oxide to react with silicon and oxygen of a silicon-containing oxide film, thereby accelerating the formation of a silicate. In this case, the annealing atmosphere may include hydrogen. A mechanism of accelerating the formation of a silicate by the introduction of hydrogen will now be described.

First, chemical reaction formulae of a manganese oxide (MnO and $Mn_2O_3$) and a silicon dioxide ($SiO_2$) are shown below. The respective chemical reaction formulae show an equilibrium state at 300K. The heat quantity of the right side means a heat quantity (kJ) per mol of manganese (Mn) and indicates the Gibbs free energy change amount (hereinafter referred to as "Gr change amount (ΔGr)") by a two-digit effective number. In this regard, the Gibbs free energy tends to voluntarily decrease. Thus, a chemical reaction having a negative Gr change amount occurs voluntarily but a chemical reaction having a positive Gr change amount does not occur voluntarily. Commercial thermodynamic database was used in the following thermodynamic calculation.

$$MnO+SiO_2 \rightarrow MnSiO_3 -21(\Delta Gr(kJ/Mn\text{-}mol)) \quad (9)$$

$$2Mn_2O_3+4SiO_2 \rightarrow 4MnSiO_3+O_2+57(\Delta Gr(kJ/Mn\text{-}mol)) \quad (10)$$

$$2Mn_2O_3+2SiO_2 \rightarrow 2Mn_2SiO_4+O_2+53(\Delta Gr(kJ/Mn\text{-}mol)) \quad (11)$$

It can be seen from chemical reaction formula (9) that, in case of MnO, a reaction can proceed from the left side to the right side. That is to say, it can be noted that there is a possibility of formation of a silicate. On the other hand, it can be seen from chemical reaction formulae (10) and (11) that a reaction cannot proceed from the left side to the right side. That is to say, it can be appreciated that there is no possibility of formation of a silicate. From the foregoing, it is possible to note that $Mn_2O_3$ is not converted into a silicate by merely performing a heat treatment and, therefore, $Mn_2O_3$ remains as it is.

Next, chemical reaction formulae of $Mn_2O_3$ and $SiO_2$ in the case of the introduction of hydrogen (H) are shown below.

$$Mn_2O_3+2SiO_2+H_2 \rightarrow 2MnSiO_3+H_2O-58(\Delta Gr(kJ/Mn\text{-}mol)) \quad (12)$$

$$Mn_2O_3+SiO_2+H_2 \rightarrow Mn_2SiO_4+H_2O-62(\Delta Gr(kJ/Mn\text{-}mol)) \quad (13)$$

It can be seen from chemical reaction formulae (12) and (13) that in the case of the introduction of hydrogen (H), a reaction can proceed from the left side to the right side even if $Mn_2O_3$ is used. That is to say, it can be noted that there is a possibility of formation of a silicate. From the foregoing, it is possible to note that due to the introduction of hydrogen, $Mn_2O_3$ is converted into a silicate and can become $MnSi_xO_y$.

Next, chemical reaction formulae of $Mn_2O_3$ are shown below.

$$2Mn_2O_3 \rightarrow 4MnO+O_2+78(\Delta Gr(kJ/Mn\text{-}mol)) \quad (14)$$

$$Mn_2O_3+H_2 \rightarrow 2MnO+H_2O-37(\Delta Gr(kJ/Mn\text{-}mol)) \quad (15)$$

It can be seen from formula (14) that in the case of non-introduction of hydrogen, $Mn_2O_3$ cannot become MnO. As shown in formulae (10) and (11), $Mn_2O_3$ cannot be converted into a silicate without hydrogen. It is therefore possible to note that in case of non-introduction of hydrogen, $Mn_2O_3$ cannot be converted into a silicate and cannot become a manganese silicate ($MnSi_xO_y$).

It can be seen from formula (15) that due to the introduction of hydrogen, $Mn_2O_3$ can become MnO. As shown in formula (9), MnO can be converted into a silicate and can become a manganese silicate ($MnSi_xO_y$). It is therefore possible to note that by the introduction of hydrogen, $Mn_2O_3$ can be converted into a silicate and can become a manganese silicate ($MnSi_xO_y$).

For reference, the chemical reaction formulae of $Mn_2O_3$ and SiO2 in the case of the introduction of oxygen (O) are considered.

$$2Mn_2O_3+4SiO_2+O_2 \rightarrow 4MnSiO_3+2O_2 \quad (16)$$

$$2Mn_2O_3+2SiO_2+O_2 \rightarrow 2Mn_2SiO_4+2O_2 \quad (17)$$

Chemical reaction formula (16) becomes identical to formula (10) if the oxygen (O) on both sides is cancelled. Chemical reaction formula (17) becomes identical to formula (11) if the oxygen (O) on both sides is cancelled. It can be seen from the foregoing that a reaction cannot proceed from the left side to the right side even if oxygen (O) is introduced. That is to say, it can be noted that a silicate is not formed. As described above, it is possible to note that $Mn_2O_3$ cannot be converted into a silicate by the introduction of oxygen (O) as disclosed in many prior art examples and further that a silicate cannot be formed unless annealing is performed by the introduction of hydrogen (H). While MnO and $Mn_2O_3$ are illustrated in the present embodiment by way of example, the same consideration can be given to $Mn_3O_4$ or $MnO_2$.

It is only necessary that the hydrogen annealing atmosphere contains hydrogen (H). The hydrogen concentration need not be 100%. For example, as described above, a forming gas may be used in light of the lower explosion limit of hydrogen.

The annealing temperature may be in a range of 300 to 600 degrees C. Practically, the annealing temperature may be equal to or higher than 350 degrees C. The process pressure is approximately 133 to 2670 Pa. In the case where a process is performed in a batch furnace or the like, it may be possible to use a process pressure of about 1 atm. As specific hydrogen annealing conditions, the process temperature may be, e.g., 400 degrees C., the process pressure may be, e.g., 267 Pa, and the annealing time may be, e.g., 30 minutes.

If the annealing temperature is set higher than the degassing temperature employed in process 1, i.e., the degassing process, the oxidization of a manganese metal can be accelerated by the chemical adsorption water contained in the silicon-containing oxide film 2. Thus, the annealing temperature set higher than the degassing temperature is suitable for the formation of a manganese silicate.

It goes without saying that the second embodiment can be practiced in combination with the manganese metal film forming method described with reference to FIG. 5 and the manganese metal film forming method described with reference to FIG. 8.

<Third Embodiment>

Next, a processing system capable of carrying out the manganese metal film forming methods according to the first and second embodiments will be described as a third embodiment of the present disclosure.

<First System Configuration Example>

Figure 10:
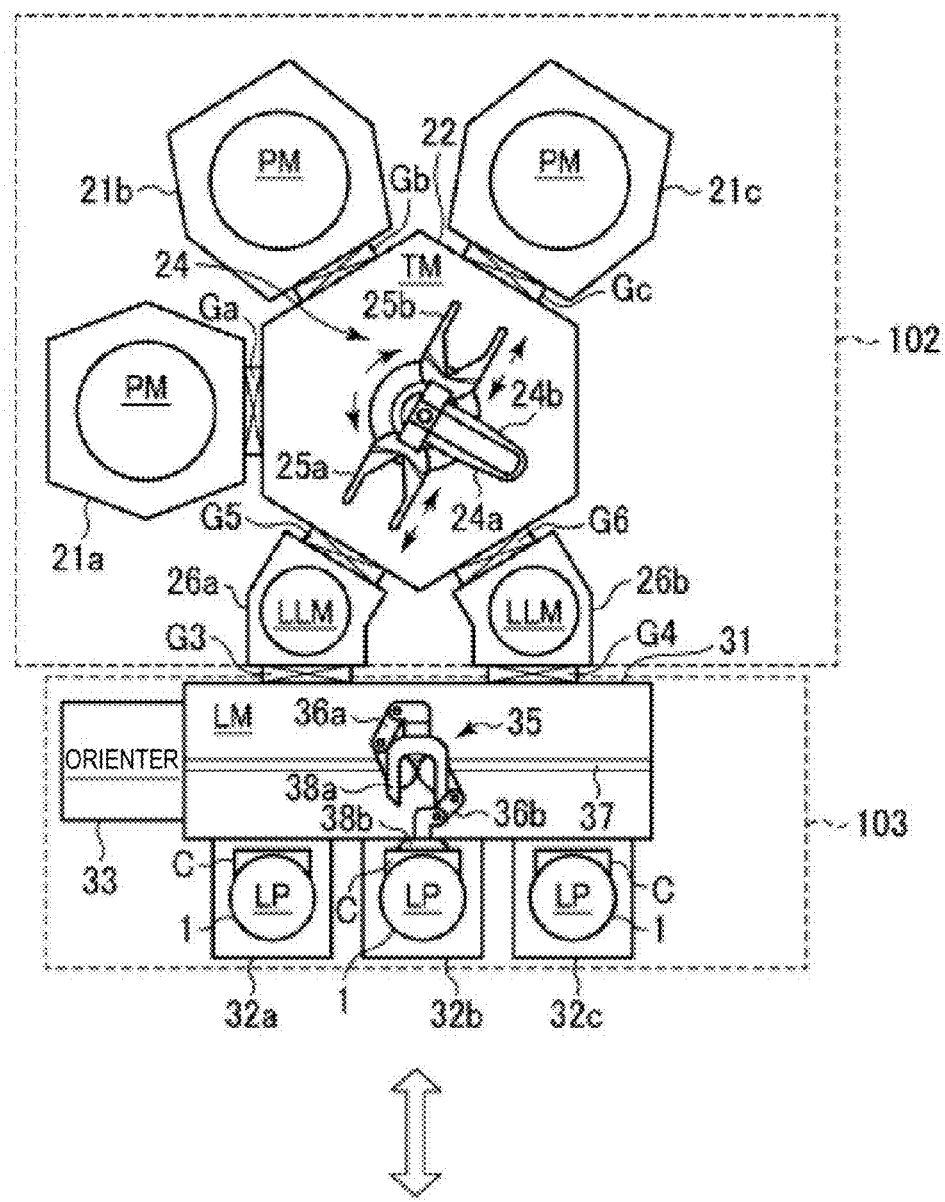
FIG. 10 is a top view showing one example of a first system configuration example of a processing system capable of carrying out the manganese metal film forming methods according to the first and second embodiments of the present disclosure.

FIG. 10 is a top view showing one example of a first system configuration example of a processing system capable of carrying out the manganese metal film forming methods according to the first and second embodiments of the present disclosure.

As shown in FIG. 10, a first processing system 101 includes a processing part 102 configured to perform a process with respect to a silicon substrate 1, a transfer part 103 configured to load and unload the silicon substrate 1 into and out of the processing part 102, and a control part 104 configured to control the processing system 101. The processing system 101 of the present example is a cluster-tool-type (multi-chamber-type) semiconductor manufacturing apparatus.

The manganese metal film forming method according to the first embodiment of the present disclosure includes three major processes, namely processes 1 to 3, as shown in FIG. 1. Therefore, in the first processing system 101, three processing units 21a to 21c configured to respectively perform the three major processes are arranged around, e.g., a single transfer chamber (TM: Transfer Module) 22. More specifically, the processing part 102 includes the processing units (PM: Process Modules) 21a to 21c serving as processing modules for carrying out different processes. Each of the processing units 21a to 21c includes a processing chamber configured to depressurize the inside thereof to a predetermined vacuum degree and perform therein one of processes 1 to 3 mentioned above.

The processing unit 21a is a degassing unit configured to perform process 1. The processing unit 21a performs a degassing process with respect to a processing target, for example, the silicon substrate 1 having the silicon-containing oxide film 2 formed on the surface thereof. The processing unit 21b is a manganese metal deposition unit configured to perform process 2. The processing unit 21b forms a manganese metal film 3 on the silicon-containing oxide film 2 subjected to the degassing process. The processing unit 21c is a metal deposition unit configured to perform process 3. The processing unit 21c forms a film containing a conductive metal, e.g., copper, ruthenium or cobalt, on the silicon substrate 1 on which the manganese metal film 3 is formed. The processing units 21a to 21c are connected to a transfer chamber 22 through gate valves Ga to Gc.

The transfer part 103 includes a transfer chamber (LM: Loader Module) 31. The transfer chamber 31 is configured to regulate the internal pressure thereof to an atmospheric pressure or a substantially atmospheric pressure, e.g., to a pressure a little higher than the ambient atmospheric pressure. In the present example, the transfer chamber 31 is a rectangle, when viewed from the top, having long sides and short sides orthogonal to the long sides. One of the long sides of the rectangle adjoins the processing part 102. The transfer chamber 31 includes load ports (LP) in which target substrate carriers C accommodating the silicon substrates 1 are installed. In the present example, three load ports 32a to 32c are installed on another long side of the transfer chamber 31 opposite the long side facing the processing part 102. However, the number of load ports is not limited thereto but may be arbitrary. Shutters not shown are respectively installed in the load ports 32a to 32c. If the carriers C accommodating the silicon substrates 1 or the empty carriers C are installed in the load ports 32a to 32c, the shutters not shown are opened to allow the inside of the carriers C and the inside of the transfer chamber 31 to communicate with each other while preventing infiltration of ambient air. An orienter 33 configured to perform alignment of the positions of notches formed in the silicon substrates 1 is installed in one of the short sides of the transfer chamber 31.

At least one load-lock chamber (LLM: Load-Lock Module), e.g., two load-lock chambers 26a and 26b in the present example, is installed between the processing part 102 and the transfer part 103. Each of the load-lock chambers 26a and 26b is configured to switch the internal pressure thereof to a predetermined vacuum degree and an atmospheric pressure or a substantially atmospheric pressure. The load-lock chambers 26a and 26b are respectively connected through gate valves G3 and G4 to one side of the transfer chamber 31 opposite to the side on which the load ports 32a to 32c are installed. The load-lock chambers 26a and 26b are also respectively connected through gate valves G5 and G6 to two sides of the transfer chamber 22 other than three sides to which the processing units 21a to 21c are connected. The load-lock chambers 26a and 26b are brought into communication with the transfer chamber 31 by opening the corresponding gate valves G3 and G, and are disconnected from the transfer chamber 31 by closing the corresponding gate valves G3 and G4. Furthermore, the load-lock chambers 26a and 26b are brought into communication with the transfer chamber 22 by opening the corresponding gate valves G5 and G6 and are disconnected from the transfer chamber 22 by closing the corresponding gate valves G5 and G6.

A transfer mechanism 35 is installed within the transfer chamber 31. The transfer mechanism 35 performs transfer of the silicon substrates 1 with respect to the target substrate carriers C. In addition, the transfer mechanism 35 performs transfer of the silicon substrates 1 with respect to the orienter 33 and transfer of the silicon substrates 1 with respect to the load-lock chambers 26a and 26b. The transfer mechanism 35 includes, e.g., two multi joint arms 36a and 36b, and is configured to move along a rail 37 extending in a longitudinal direction of the transfer chamber 31. Hands 38a and 38b are installed at the tip ends of the multi-joint arms 36a and 36b, respectively. The transfer of the silicon substrate 1 is performed while the silicon substrate 1 is placed on the hand 38a or 38b.

The transfer chamber 22 is configured to be vacuum maintainable, e.g., a vacuum container. A transfer mechanism 24 configured to perform transfer of the silicon substrate 1 between the processing units 21a to 21c and the load-lock chambers 26a and 26b is installed within the transfer chamber 22. Thus, the silicon substrate 1 is transferred in a state where the silicon substrate 1 is isolated from the atmosphere. The transfer mechanism 24 is arranged substantially at the center of the transfer chamber 22. The transfer mechanism 24 includes, e.g., a plurality of rotatable and extendible transfer arms. In the present example, the transfer mechanism 24 includes, e.g., two transfer arms 24a and 24b. Holders 25a and 25b are installed at the tip ends of the transfer arms 24a and 24b, respectively. The transfer of the silicon substrate 1 between the processing units 21a to 21c and the load-lock chambers 26a and 26b as mentioned above is performed while the silicon substrate 1 is held by the holder 25a or 25b.

The control part 104 includes a process controller 41, a user interface 42 and a storage unit 43. The process controller 41 is formed of a microprocessor (computer). The user interface 42 includes a keyboard through which an operator performs a command input operation or other operations to manage the processing system 101, a display configured to visually display the operation situation of the processing system 101, and so forth. The storage unit 43 stores a control program for realizing the processes carried out in the processing system 101 under the control of the process controller 41, various types of data, and recipes for causing the processing system 101 to execute processes pursuant to processing conditions. The recipes are stored in a storage medium of the storage unit 43. The storage medium, which is computer-readable, may be, e.g., a hard disk or a portable storage medium such as a CD-ROM, a DVD, a flash memory or the like. Alternatively, recipes may be appropriately transmitted from other devices via, e.g., a dedicated line. In response to an instruction sent from the user interface 42, at least one recipe is called out from the storage unit 43 and is executed by the process controller 41. Thus, under the control of the process controller 41, the manganese metal film forming methods according to the first and second embodiments are carried out with respect to the silicon substrate 1.

The annealing (process 5 in FIG. 9) performed in a reducing atmosphere after the manganese metal deposition (process 2), or the annealing (process 4 in FIG. 8) optionally performed in an oxidizing atmosphere when process 3 is a copper depositing process as shown in FIG. 8, can be performed by the processing unit 21c which performs, e.g., a metal deposition process as process 3.

Figure 11:
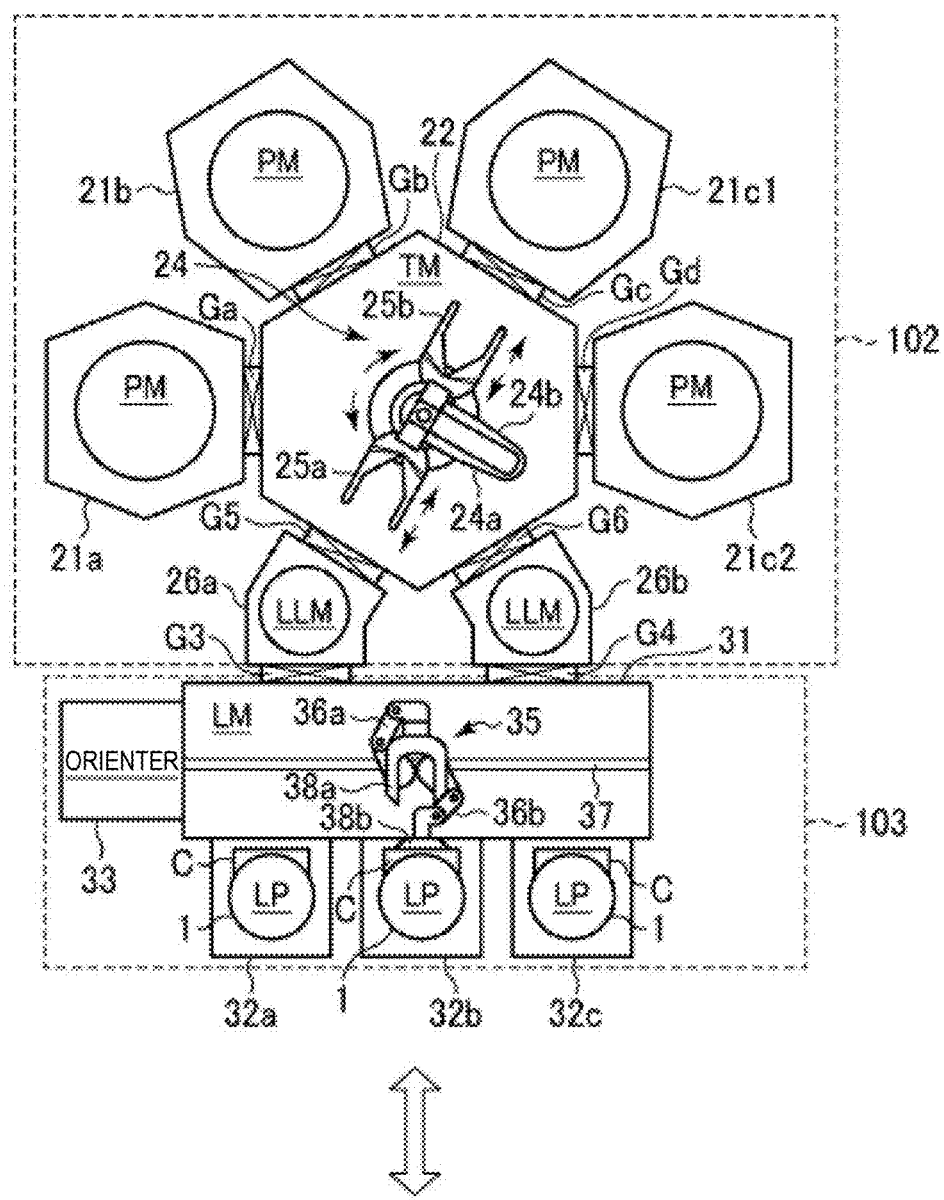
FIG. 11 is a top view showing another example of the first system configuration example of the processing system capable of carrying out the manganese metal film forming methods according to the first and second embodiments of the present disclosure.

FIG. 11 is a top view showing another example of the first system configuration example of the processing system capable of carrying out the manganese metal film forming methods according to the first and second embodiments of the present disclosure.

As shown in FIG. 11, in the first system configuration example, the processing unit 21c configured to perform the metal deposition process can be divided into two processing units 21c1 and 21c2.

The processing unit 21c1 shown in FIG. 11 is, e.g., a metal deposition unit configured to perform a part of process 3 shown in FIG. 1. The processing unit 21c1 forms a film containing a conductive metal, e.g., ruthenium or cobalt, on the silicon substrate 1 on which the manganese metal film 3 is formed. That is to say, the processing unit 21c1 performs, e.g., process 3a shown in FIG. 5.

The processing unit 21c2 is, e.g., a metal deposition unit configured to perform a part of process 3 shown in FIG. 1. The processing unit 21c2 forms a film containing a conductive metal, e.g., copper, on the silicon substrate 1 on which the film containing ruthenium or cobalt is formed. That is to say, the processing unit 21c2 performs, e.g., process 3b shown in FIG. 5.

As described above, in case of forming plural types of metallic films, the metal deposition unit may be divided into plural ones depending on, e.g., the types of the metallic films.

The manganese metal film forming methods according to the first and second embodiments can be carried out by the processing systems shown in FIGS. 10 and 11.

<Second System Configuration Example>

Figure 12:
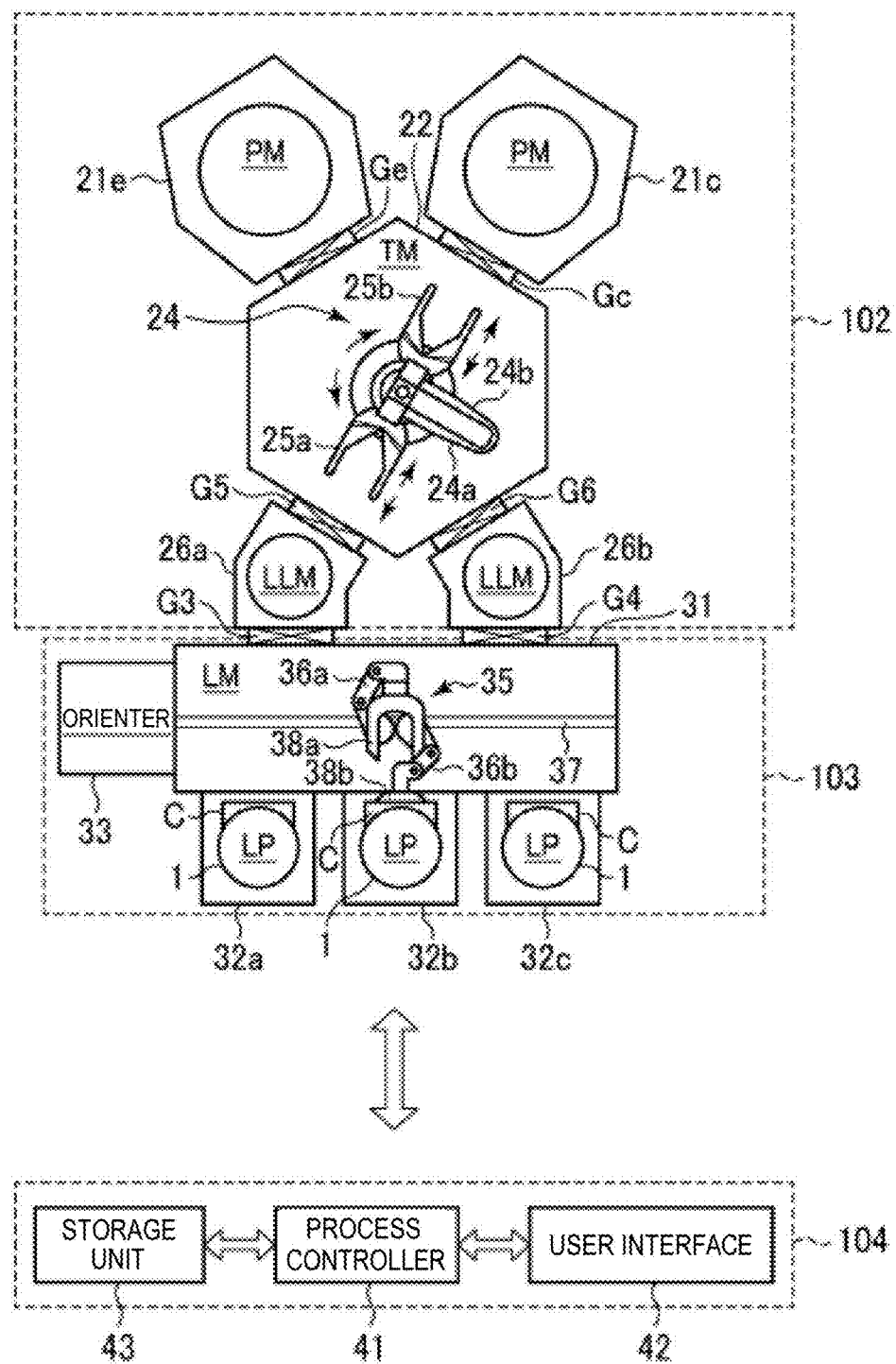
FIG. 12 is a top view showing one example of a second system configuration example of a processing system capable of carrying out the manganese metal film forming methods according to the first and second embodiments of the present disclosure.

FIG. 12 is a top view showing one example of a second system configuration example of a processing system capable of carrying out the manganese metal film forming methods according to the first and second embodiments of the present disclosure.

As shown in FIG. 12, a second processing system 201 differs from the first processing system 101 in that the degassing unit and the manganese metal deposition unit are formed into a single processing module. Thus, the second processing system 201 includes a degassing and manganese metal deposition chamber 21e which is formed of a processing module for performing the degassing process (process 1) and the manganese metal deposition process (process 2), and a metal deposition unit 21c which is formed of a processing module for performing the metal deposition process (process 3). The processing unit 21e is connected to the transfer chamber 22 through a gate valve Ge. In other points, the second processing system 201 remains substantially the same as the first processing system 101.

As one example of the process performed in the processing unit 21e, the processing pressure is changed in the degassing process (process 1) and the manganese metal deposition process (process 2) without changing the setting temperature of, e.g., a stage heater (a substrate mounting table with a heating function) not shown. Taking an example of specific numerical values, while the setting temperature of the stage heater is fixed at 395 degrees C., the pressure within the processing unit 21e accommodating the silicon substrate 1 is set at a vacuum pressure (vacuum-evacuation is continuously performed during the degassing process)during the degassing process (process 1)and the pressure within the processing unit 21e is set at 133 Pa which is higher than the pressure available in the degassing process (process 1)during the manganese metal deposition process (process 2). If the processing pressure is changed as described above, the temperature of the silicon substrate 1 can be set at, e.g., about 270 degrees C. in the degassing process (process 1) and the temperature of the silicon substrate 1 can be set at, e.g., about 350 degrees C. in the manganese metal deposition process (process 2), thereby generating a temperature difference of about 80 degrees C. in the silicon substrate 1.

As described above, the pressure within the processing unit 21e during the degassing process (process 1) is kept low and the pressure within the processing unit 21e during the manganese metal deposition process (process 2) is kept higher than the pressure available in process 1. With this configuration, even if the setting temperature of the stage heater is not changed, it is possible to heat the silicon substrate 1 at a higher temperature in process 2 than in process 1. Thus, it is possible to reduce, e.g., the standby time taken from the change of the setting temperature of the stage heater to the stabilization of the temperature of the stage heater.

According to the second processing system 201, process 1 and process 2 are performed in the single processing unit 21e. This makes it possible to obtain an advantage in that, as compared with the first processing system 101, it is possible to reduce the transfer time required in transferring the silicon substrate 1 from the processing unit 21a for performing process 1 to the processing unit 21b for performing process 2. Moreover, the number of processing modules can be reduced by performing a plurality of processes in a single processing unit.

Accordingly, the second processing system 201 can obtain an additional advantage in that, as compared with the first processing system 101, it is advantageous in increasing the throughput when manufacturing an electronic device, e.g., a semiconductor integrated circuit device.

Figure 13:
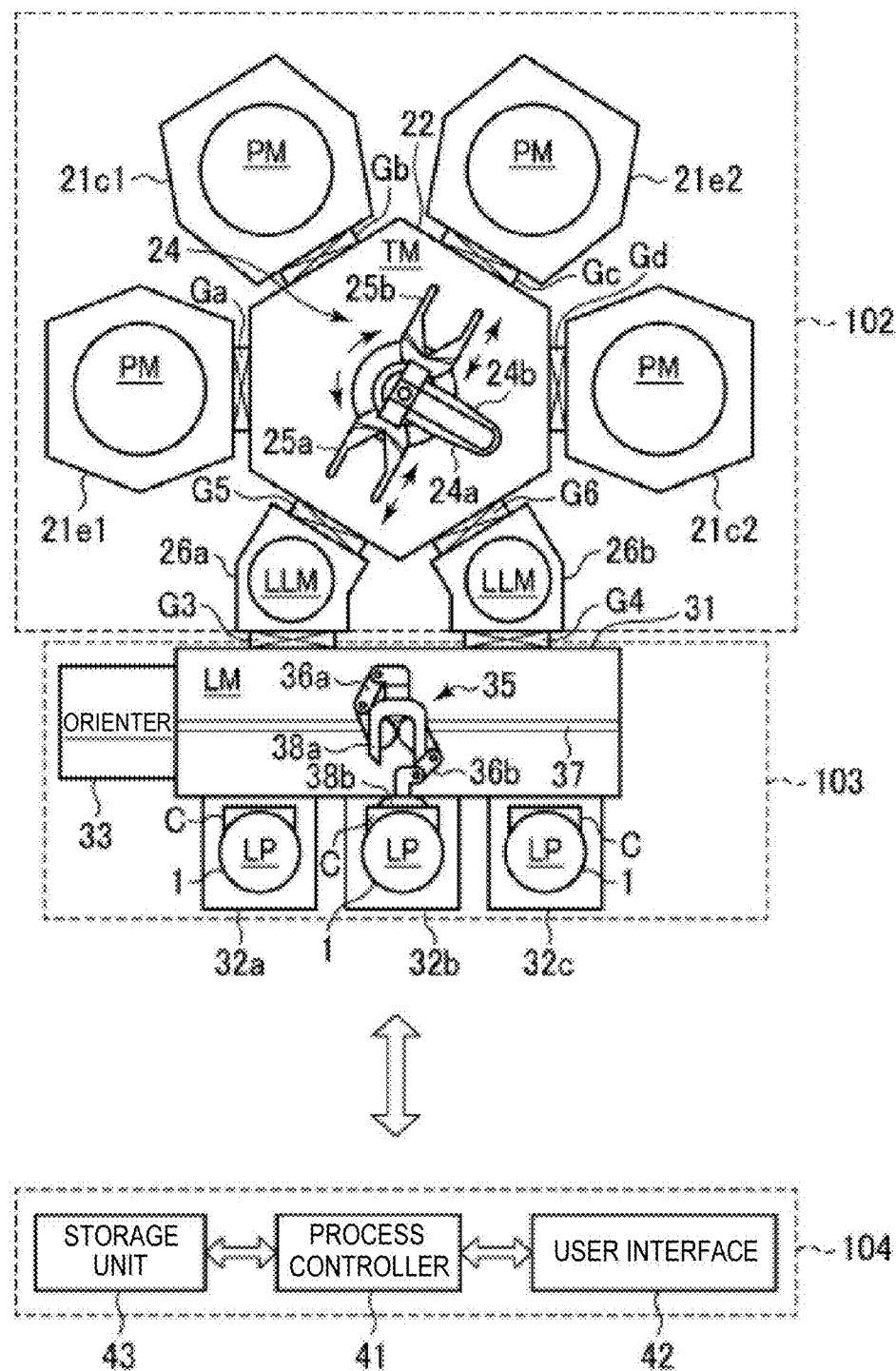
FIG. 13 is a top view showing another example of the second system configuration example of the processing system capable of carrying out the manganese metal film forming methods according to the first and second embodiments of the present disclosure.

FIG. 13 is a top view showing another example of the second system configuration example of the processing system capable of carrying out the manganese metal film forming methods according to the first and second embodiments of the present disclosure.

In the example of the second configuration example shown in FIG. 13, as compared with the example shown in FIG. 12, the processing unit 21e is increased to, e.g., two processing units 21e1 and 21e2 and the processing unit 21c is increased to, e.g., two processing units 21c1 and 21c2. If the processing units thus increased are arranged in a single processing system 201, it is possible to enhance the throughput twice.

The manganese metal film forming methods according to the first and second embodiments can be carried out by the processing system shown in FIGS. 12 and 13.

<Other Application>

While the first and second embodiments of the present disclosure have been described above, the present disclosure is not limited to the first and second embodiments but may be appropriately modified without departing from the spirit of the present disclosure.

TEST EXAMPLE

The following are descriptions of test examples of the present disclosure.

Test Example 1

In this example, a SiOC film was formed on a silicon wafer by a CVD method. Degassing was performed at 300 degree C. Thereafter, a sample was produced by depositing a manganese film using bis(N,N'-1-alkylamide-2-dialkylaminoalkane) manganese as a manganese precursor and using a hydrogen gas as a reducing reaction gas. The deposition of the manganese film was performed in three ways, namely by supplying no oxidizing agent, by supplying $H_2O$ as an oxidizing agent at 0.1 sccm and by supplying $H_2O$ as an oxidizing agent at 0.3 sccm. The film formation conditions were set as follows.

Figure 14:
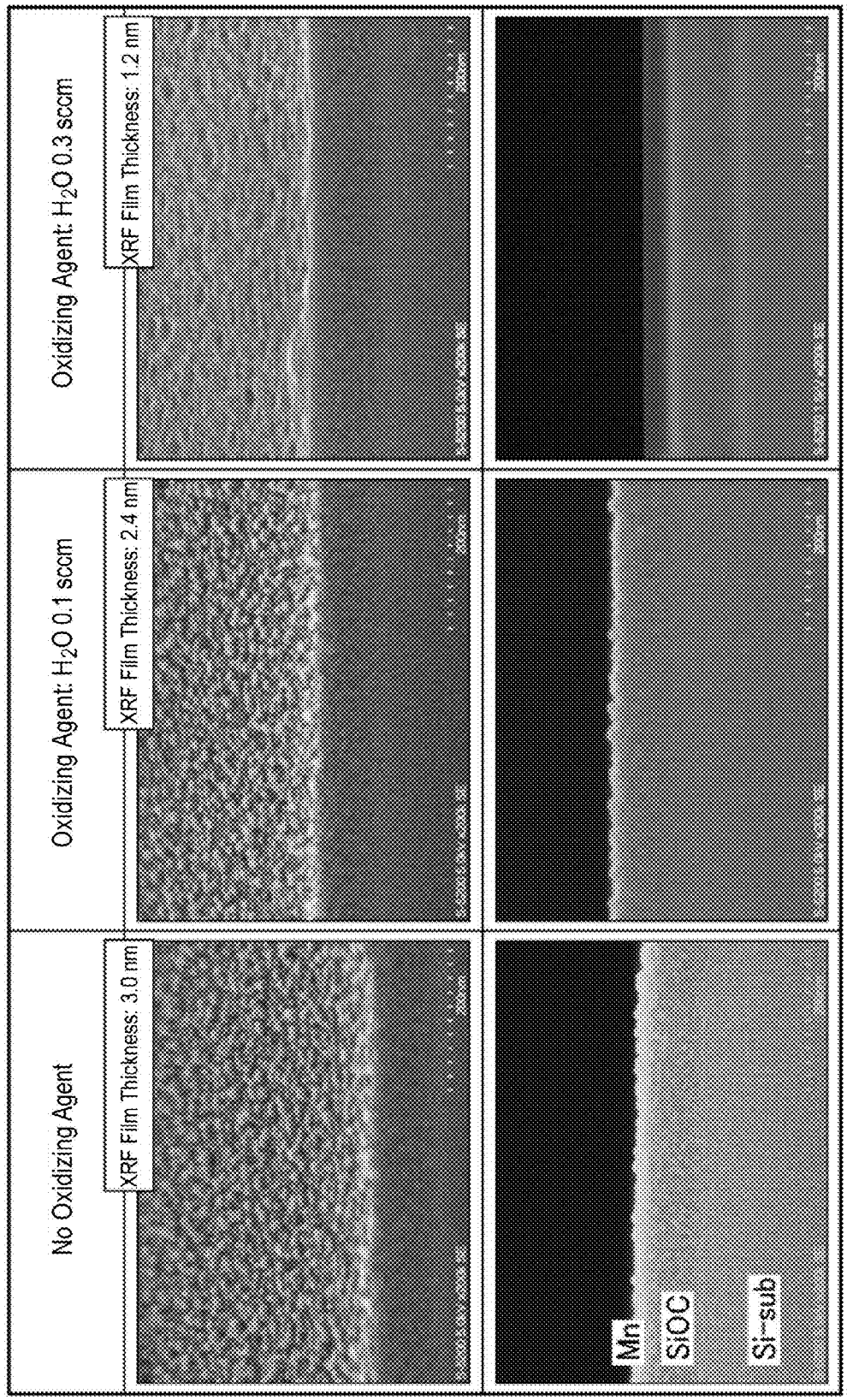
FIG. 14 shows SEM photographs of manganese films formed by changing the amount of $H_2O$ as an oxidizing agent to 0 sccm, 0.1 sccm and 0.3 sccm in test example 1.

Film formation pressure: 133 Pa (1 Torr)
Film formation temperature: 350 degrees C.
Film formation time: 60 seconds SEM (Scanning Electron Microscope) photographs of the surfaces and cross sections of the films thus formed are shown in FIG. 14. The film thickness was measured using an XRF (X-ray fluorescence) spectrometer and converted in terms of MnO (the same will be applied to the following description). As shown in FIG. 14, the film becomes granular when no oxidizing agent is introduced. However, the granulation is alleviated by introducing an oxidizing agent at 0.1 sccm, and it was confirmed that a continuous film is obtained when the oxidizing agent is introduced at 0.3 sccm.

Test Example 2

In this example, just like test example 1, a SiOC film was formed on a silicon wafer by a CVD method. Degassing was performed at 300 degree C. Thereafter, a sample was produced by depositing a manganese film using bis(N,N'-1-alkylamide-2-dialkylaminoalkane) manganese as a manganese precursor and using a hydrogen gas as a reducing reaction gas. The deposition of the manganese film was performed in three ways, namely by supplying no oxidizing agent, by supplying dry air as an oxidizing agent at 0.4 sccm and by supplying dry air as an oxidizing agent at 1.0 sccm. The film formation conditions were set just like those of test example 1.

Figure 15:
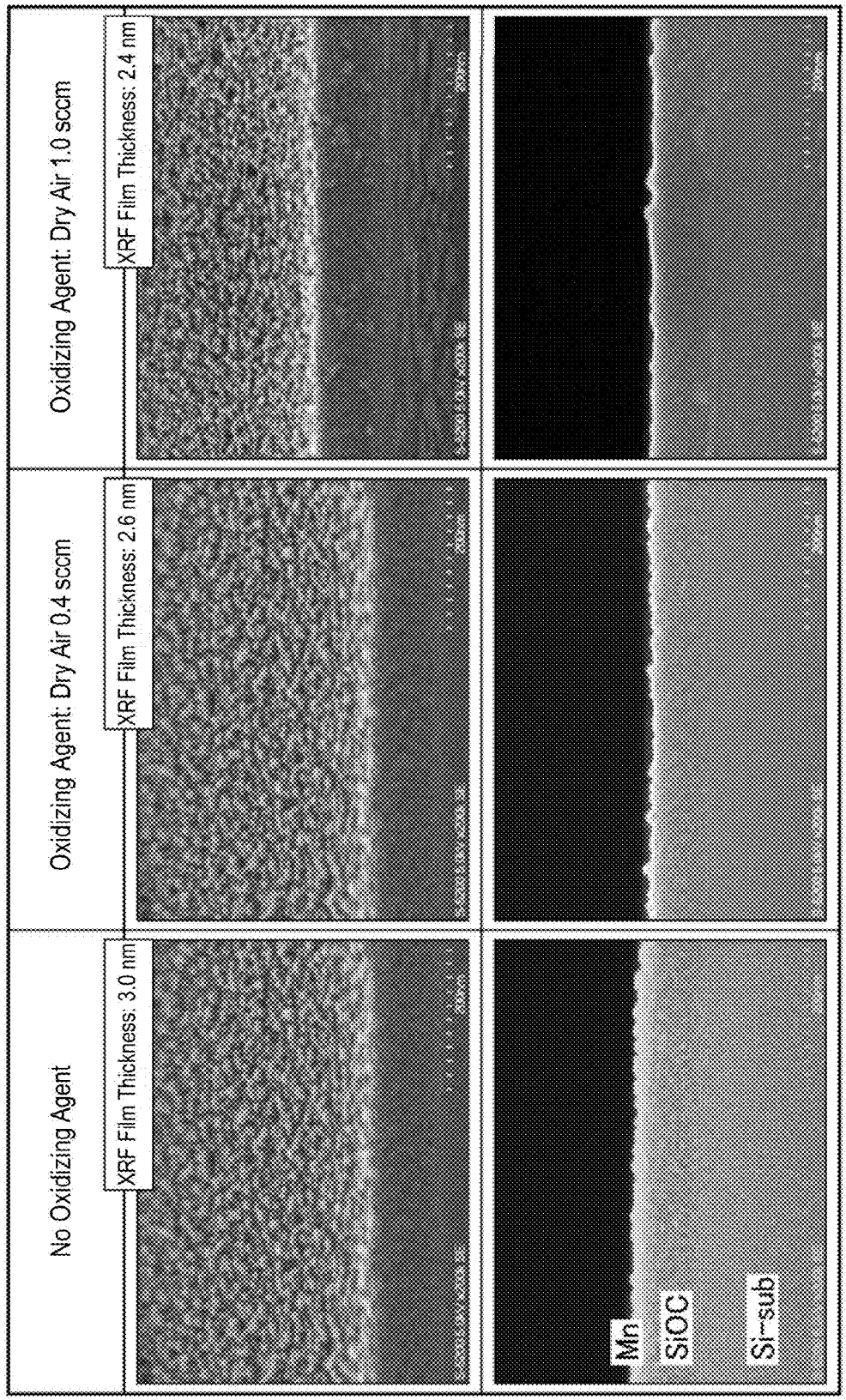
FIG. 15 shows SEM photographs of manganese films formed by changing the amount of dry air as an oxidizing agent to 0 sccm, 0.4 sccm and 1.0 sccm in test example 2.

SEM photographs of the surfaces and cross sections of the films thus formed are shown in FIG. 15. As shown in FIG. 15, when dry air is used as the oxidizing agent, the film shows a granular shape even when the flow rate of the oxidizing agent is 1.0 sccm.

Test Example 3

A test was performed in which an increased amount of dry air is supplied as an oxidizing agent. In this example, a $SiO_2$ film was formed on a silicon wafer by a CVD method that makes use of TEOS. Degassing was performed at 300 degree C. Thereafter, a sample was produced by depositing a manganese film using bis(N,N'-1-alkylamide-2-dialkylaminoalkane) manganese as a manganese precursor and using a hydrogen gas as a reducing reaction gas. The deposition of the manganese film was performed in three ways, namely by supplying no oxidizing agent, by supplying dry air as an oxidizing agent at 1.3 sccm and by supplying dry air as an oxidizing agent at 3.0 sccm. The film formation conditions were set as follows.

Figure 16:
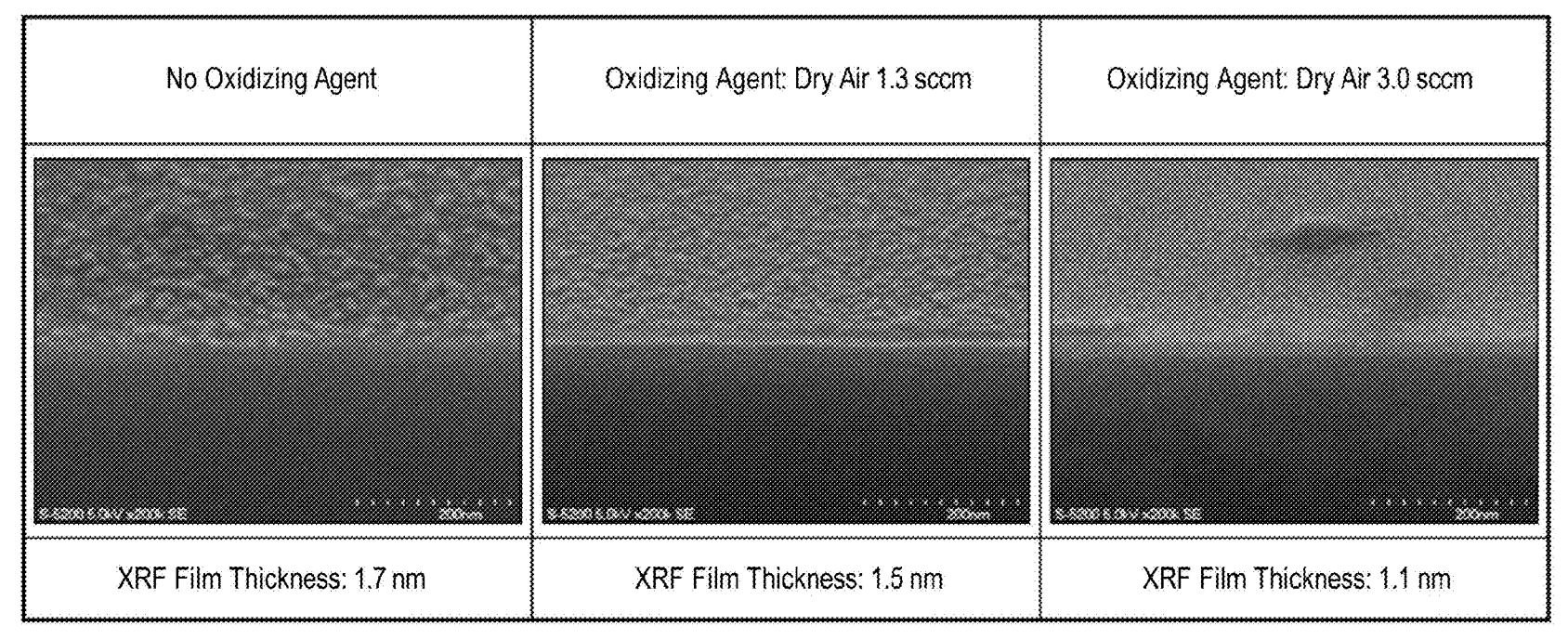

Film formation pressure: 133 Pa (1 Torr)
Film formation temperature: 350 degrees C.
Film formation time: 60 seconds SEM photographs of the surfaces and cross sections of the films thus formed are shown in FIG. 16. As shown in FIG. 16, when the supply amount of the dry air becomes 1.3 sccm, the size of granules becomes smaller and the density of the film grows higher. It was confirmed that, when the supply amount of the dry air becomes 3.0 sccm, the density of the film becomes much higher and the film becomes a substantially continuous film.

Test Example 4

In this example, TEM (Transmission Electron Microscope) photographs and HAADF (High-angle Annular Darkfield) photographs using an STEM (Scanning Transmission Electron Microscope) were taken with respect to a sample obtained by depositing a manganese film without supplying a oxidizing agent in the same manner as in test example 1, a sample obtained by depositing a manganese film while supplying $H_2O$ as an oxidizing agent at 0.3 sccm in the same manner as in test example 1, and a sample obtained by depositing a manganese film while supplying dry air as an oxidizing agent at 3.0 sccm in the same manner as in test example 3. The film formation time was set equal to 60 seconds in all cases.

Figure 17:
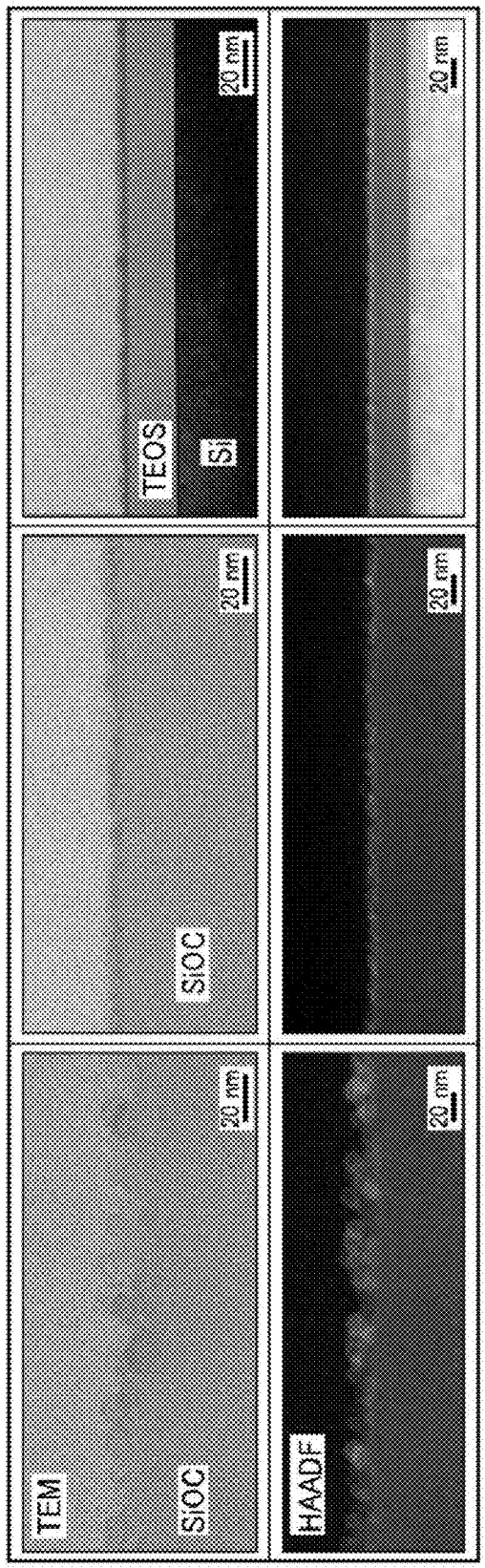
FIG. 17 shows TEM photographs and HAADF photographs of a sample deposited without using an oxidizing agent, a sample deposited by supplying $H_2O$ as an oxidizing agent at 0.3 sccm and a sample deposited by supplying dry air as an oxidizing agent at 3.0 sccm, in test example 4.

The results are shown in FIG. 17. As shown in FIG. 17, in the case of the sample being obtained by not introducing an oxidizing agent, the film agglomerates in a granular shape. In the cases of the samples being obtained by introducing an oxidizing agent, it was confirmed that the granular agglomeration of the film is prevented and a high-contrast layer is formed. From an XPS (X-ray Photoelectron Spectroscopy) analysis result on the sample obtained by depositing a manganese film while supplying dry air as an oxidizing agent at 3 sccm, it was confirmed that the sample is mainly composed of $MnO_x$ and is partially converted to silicate.

Test Example 5-1

In this example, a SiOC film was formed on a silicon wafer by a CVD method. Degassing was performed at 300 degree C. Thereafter, samples were produced by depositing a manganese film at 350 degree C. using bis(N,N'-1-alkylamide-2-dialkylaminoalkane) manganese as a manganese precursor and using a hydrogen gas as a reducing reaction gas. The samples include a sample ("No Oxidizing Agent") obtained by depositing a manganese film without supplying an oxidizing agent, a sample ("D-Air 1.3 sccm") obtained by depositing a manganese film while supplying dry air as an oxidizing agent at 1.3 sccm, a sample ("D-Air 3.0 sccm") obtained by depositing a manganese film while supplying dry air as an oxidizing agent at 3.0 sccm, and a sample ("D-Air 3.0 sccm (First Half Only)") obtained by depositing a manganese film while supplying dry air as an oxidizing agent at 3.0 sccm only in the first half of a film forming process. The samples were formed into thick films having a target film thickness of 50 nm so that the sheet resistances thereof can be measured.

Figure 18:
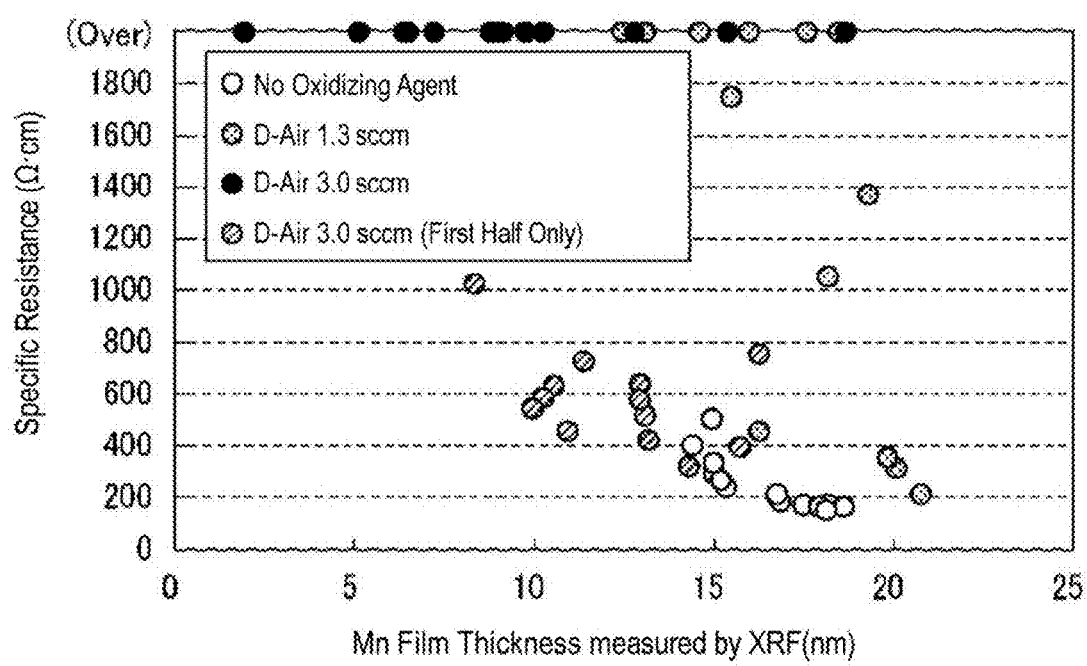
FIG. 18 is a view showing the relationship between film thicknesses and specific resistances (resistivity) of a sample obtained by depositing a manganese film without using an oxidizing agent, a sample obtained by depositing a manganese film while supplying dry air as an oxidizing agent at 1.3 sccm, a sample obtained by depositing a manganese film while supplying dry air at 3.0 sccm, and a sample obtained by depositing a manganese film while supplying dry air at 3.0 sccm only in the first half of a film forming process, in test example 5-1.

With respect to each of the aforementioned four types of samples, sheet resistances were measured at a plurality of points within a wafer plane. The measurement results converted to specific resistances are shown in FIG. 18. In FIG. 18. The conversion was conducted under the assumption that the manganese film deposited on the wafer is a continuous metal film. As shown in FIG. 18, the sheet resistance (specific resistance) could be measured with respect to the sample "D-Air 1.3 sccm". However, the sheet resistance (specific resistance) could not be measured with respect to the sample "D-Air 3.0 sccm". This is because, the manganese film deposited on the wafer is not completely oxidized and Mn remains in a metal state in the sample "D-Air 1.3 sccm", but the oxidation degree grows larger and the film becomes a film mainly composed of $MnO_x$ with the increase of the amount of dry air as an oxidizing agent to 3.0 sccm. The sample "D-Air 1.3 sccm" shows large variation in the specific resistance.

However, in the cases of the samples "No Oxidizing Agent" and "D-Air 3.0 sccm (First Half Only)", the sheet resistances (specific resistances) are stable. Thus, it is presumed that, a manganese metal exists in an upper layer for the sample "D-Air 3.0 sccm (First Half Only)".

Test Example 5-2

In order to confirm the aforementioned points in detail, the thick films having the target film thickness of 50 nm were subjected to XPS analysis while being etched from the surface thereof by Ar sputtering. The XPS analysis results for the respective samples are shown in FIGS. 19A to 22B. FIGS. 19A, 20A, 21A and 22A show a spectrum of Mn2p, and FIGS. 19B, 20B, 21B and 22B show concentrations of individual elements in the depth direction of the film.

Figure 19B:
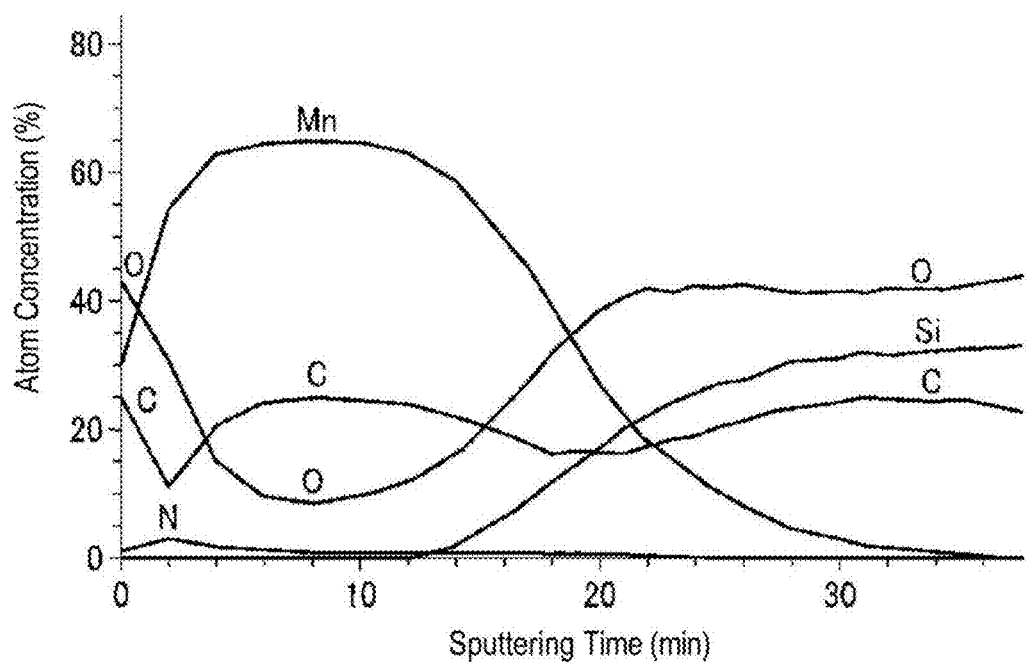
Figure 21A:
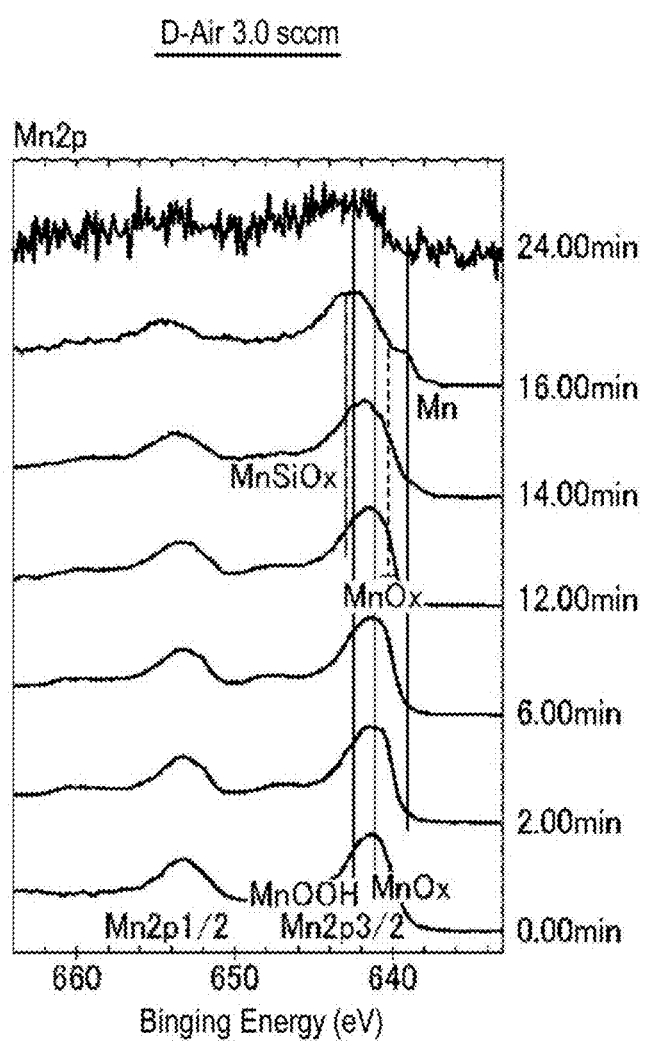
FIGS. 21A and 21B are views showing the XPS analysis results of a sample obtained by depositing a manganese film while supplying dry air as an oxidizing agent at 3.0 sccm in test example 5-2.
Figure 21B:
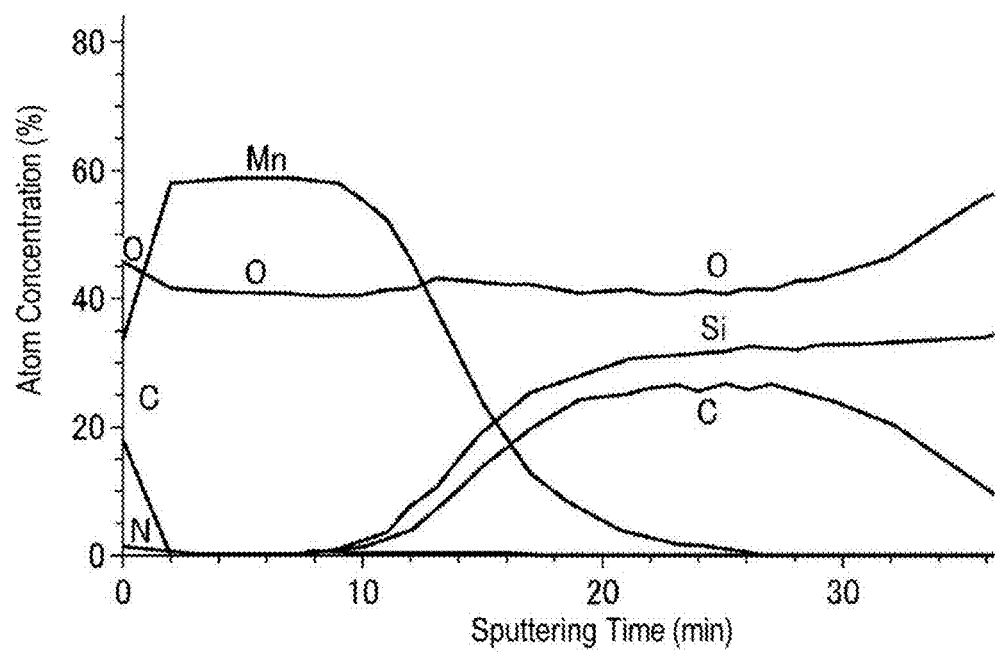
Figure 22B:
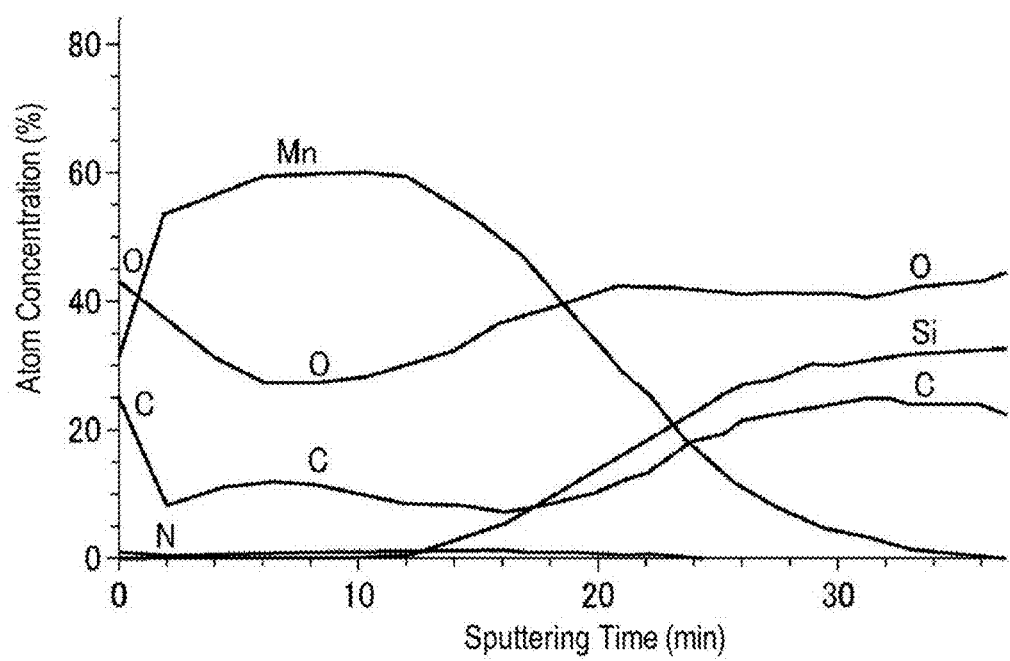

As shown in FIGS. 19A and 19B, although the manganese film deposited without using an oxidizing agent shows atmospheric oxidation on the surface thereof, the manganese film mainly consists of metallic bonds and the ratio of Mn, O and C is equal to about 65:10:25(%). Thus, the manganese film is substantially formed of a manganese metal film. On the other hand, as shown in FIGS. 20A to 21B, in the cases of the samples "D-Air 1.3 sccm" and "D-Air 3.0 sccm", the film is mainly composed of Mn—O bonds and the ratio of Mn and O is equal to about 60:40(%) (in the case of the sample "D-Air 3.0 sccm", the ratio of O may be decreased due to sputtering). That is to say, it was confirmed that the samples "D-Air 1.3 sccm" and "D-Air 3.0 sccm" are mainly composed of $MnO_x$ although the specific ratio of Mn and O may vary. In the case of the sample "D-Air 1.3 sccm", since the time period elapsed from the film formation time is short at the time point of measurement of the sheet resistance shown in FIG. 18, Mn as a metal still remains in the film. However, at the time point of the XPS measurement shown in FIGS. 20A and 20B, the time period elapsed from the film formation time is long. Thus, the sample is oxidized by the ambient air and the analysis results are identical in the sample "D-Air 1.3 sccm" shown in FIGS. 20A and 20B and in the sample "D-Air 3.0 sccm" shown in FIGS. 21A and 21B. In contrast, as shown in FIGS. 22A and 22B, in the case of the sample "D-Air 3.0 sccm (First Half Only)", it was confirmed that Mn—O bonds and metal bonds coexist, the ratio of Mn, O and C is equal to about 60:30:10 (%) and a $MnO_x$ film and a Mn film coexist. If an oxidizing agent is supplied only in the first half of a film forming process, partially-oxidized manganese becomes a nuclei, thereby forming a continuous film mainly composed of $MnO_x$. Thereafter, a manganese metal film grows on the continuous film by stopping the supply of an oxidizing agent. It is presumed that a laminated structure of $Mn/MnO_x$ in the sample "D-Air 3.0 sccm (First Half Only)" is formed in the aforementioned manner.

While certain embodiments have been described, these embodiments have been presented by way of example only, and are not intended to limit the scope of the disclosures. Indeed, the novel methods, systems and devices described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A manganese metal film forming method, comprising:
   degassing an underlying layer formed on a processing target by thermally treating the processing target, the underlying layer containing silicon and oxygen; and
   forming a manganese metal film on the degassed underlying layer by chemical deposition using a gas containing a manganese compound,
   wherein forming a manganese metal film includes introducing a gas containing an oxidizing agent to form a partially-oxidized manganese metal film.

2. The method of claim 1, wherein an interfacial layer made of a manganese silicate or a manganese oxide is formed in an interface between the partially-oxidized manganese metal film and the underlying layer.

3. The method of claim 2, wherein at least a portion of the interfacial layer is formed at the side of the underlying layer.

4. The method of claim 1, wherein a surface portion of the partially-oxidized manganese metal film is made of a manganese metal alone or a manganese metal higher in percentage than a manganese oxide.

5. The method of claim 1, wherein introducing a gas containing an oxidizing agent comprises decreasing the amount of gas introduced after an initial manganese metal film forming stage.

6. The method of claim 1, further comprising:
   annealing, in a reducing atmosphere, the processing target on which the partially-oxidized manganese metal film is formed, after forming a manganese metal film.

7. The method of claim 6, annealing the processing target includes setting an annealing temperature to be set higher than a degassing temperature.

8. The method of claim 1, wherein the gas containing the oxidizing agent contains at least one oxidizing agent selected from the group consisting of $H_2O$, $O_2$, $CO_2$, HCOOH and $NO_x$ including $N_2O$, NO and $NO_2$.

9. The method of claim 1, wherein the partially-oxidized manganese metal film is a continuous thin film having a thickness equal to or larger than 1 nm and smaller than 10 nm.

10. The method of claim 1, wherein the gas containing the manganese compound is at least one gas selected from the group consisting of a cyclopentadienyl-based manganese compound gas, a carbonyl-based manganese compound gas, a betadiketone-based manganese compound gas, an amidinate-based manganese compound gas and an amideaminoalkane-based manganese compound gas.

11. The method of claim 10, wherein the cyclopentadienyl-based manganese compound gas is a manganese compound gas expressed by a chemical formula of $Mn(RC_5H_4)_2$, where R is a functional group described by $—C_nH_{2n+1}$ (where n is an integer of 0 or greater).

12. The method of claim 10, wherein the carbonyl-based manganese compound gas is selected from the group consisting of $Mn_2(CO)_{10}$, $(CH_3C_5H_4)Mn(CO)_3$, $(C_5H_5)Mn(CO)_3$, $(CH_3)Mn(CO)_5$ and 3-(t-BuAllyl)$Mn(CO)_4$.

13. The method of claim 10, wherein the betadiketone-based manganese compound gas is selected from the group consisting of $Mn(C_{11}H_{19}O_2)_2$, $Mn(C_{11}H_{19}O_2)_3$, $Mn(C_5H_7O_2)_2$, $Mn(C_5H_7O_2)_3$, $Mn(C_5HF_6O_2)_2$ and $Mn(C_5HF_6O_2)_3$.

14. The method of claim 10, wherein the amidinate-based manganese compound gas is a manganese compound gas expressed by a chemical formula of $Mn(R^1N—CR^3—NR^2)_2$, where $R^1$, $R^2$ and $R^3$ are functional groups described by $—C_nH_{2n+1}$ (where n is an integer of 0 or greater).

15. The method of claim 10, wherein the amideaminoalkane-based manganese compound gas is a manganese compound gas expressed by a chemical formula of $Mn(R^1N-Z-NR^2{}_2)_2$, where $R^1$ and $R^2$ are functional groups described by $-C_nH_{2n+1}$ (where n is an integer of 0 or greater) and Z is a functional group described by $-C_nH_{2n}-$ (where n is an integer of 0 or greater).

16. The method of claim 1, further comprising:
   forming a metallic film on the manganese metal film formed when forming a manganese metal film.

17. The method of claim 16, wherein the metallic film is formed while subjecting the metallic film to a reflow by heating the processing target on which the manganese metal film is formed.

18. The method of claim 16, further comprising:
   annealing, in a reducing atmosphere, the processing target on which the metallic film is formed.

19. The method of claim 16, wherein the metallic film contains copper.

20. A manufacturing method of an electronic device having an underlying layer containing silicon and oxygen and a manganese-containing structure formed on the underlying layer, the method comprising:
   forming a partially-oxidized manganese metal film on the underlying layer containing silicon and oxygen according to the method of claim 1 to thereby form an interfacial layer made of a manganese silicate film in an interface between the partially-oxidized manganese metal film and the underlying layer in the manganese-containing structure.

21. The method of claim 20, wherein the manganese-containing structure is a barrier film formed between a conductive metal wiring and the underlying layer serving as an inter-layer insulating film and configured to suppress diffusion of a conductive metal contained in the conductive metal wiring.

22. The method of claim 21, wherein the conductive metal forming the conductive metal wiring includes at least one element selected from the group consisting of copper, ruthenium and cobalt.

23. An electronic device, comprising:
   an underlying layer containing silicon and oxygen; and
   a manganese-containing structure formed on the underlying layer,
   wherein the manganese-containing structure is formed according to the method of claim 20.

24. The device of claim 23, wherein the manganese-containing structure is a barrier film formed between a conductive metal wiring and the underlying layer serving as an inter-layer insulating film and configured to suppress diffusion of a conductive metal contained in the conductive metal wiring.

25. The device of claim 24, wherein the conductive metal forming the conductive metal wiring includes at least one element selected from the group consisting of copper, ruthenium and cobalt.

26. A processing system for forming a manganese silicate film by converting a manganese metal into a silicate, comprising:
   a degassing unit configured to perform a degassing process with respect to a processing target having an underlying layer containing silicon and oxygen;
   a manganese metal deposition unit configured to form a manganese metal film by depositing a manganese metal on the degassed processing target; and
   a metal deposition unit configured to form a metallic film by depositing a metal on the processing target on which the manganese metal is deposited,
   wherein the degassing unit is configured to perform degassing an underlying layer of claim 1 and the manganese metal deposition unit is configured to perform forming a manganese metal film of claim 1.

27. The system of claim 26, wherein, if plural types of metal are deposited on the processing target, the metal deposition unit is comprised of a plurality of metal deposition units depending on the types of metals.

28. The system of claim 26, wherein the degassing unit and the manganese metal deposition unit are formed into a single degassing and manganese-metal-deposition unit.

29. The system of claim 28, wherein the degassing and manganese-metal-deposition unit is configured to change a processing pressure without changing a setting temperature in degassing an underlying layer and forming a manganese metal film, so that a difference between a temperature of the processing target in degassing an underlying layer and a temperature of the processing target in forming a manganese metal film is generated.

30. The system of claim 28, wherein each of the degassing and manganese-metal-deposition unit and the metal deposition unit is provided in plural numbers.

* * * * *